United States Patent
Chang et al.

(10) Patent No.: US 11,563,097 B2
(45) Date of Patent: Jan. 24, 2023

(54) HIGH ELECTRON MOBILITY TRANSISTOR AND FABRICATION METHOD THEREOF

(71) Applicant: INNOSCIENCE (ZHUHAI) TECHNOLOGY CO., LTD., Zhuhai (CN)

(72) Inventors: Ming-Hong Chang, Zhuhai (CN); Kingyuen Wong, Zhuhai (CN); Han-Chin Chiu, Zhuhai (CN); Hang Liao, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 210 days.

(21) Appl. No.: 16/955,091

(22) PCT Filed: Dec. 27, 2019

(86) PCT No.: PCT/CN2019/129379
§ 371 (c)(1),
(2) Date: Jun. 18, 2020

(87) PCT Pub. No.: WO2020/135770
PCT Pub. Date: Jul. 2, 2020

(65) Prior Publication Data
US 2020/0365699 A1 Nov. 19, 2020

(30) Foreign Application Priority Data
Dec. 29, 2018 (CN) .......................... 201811639089.0

(51) Int. Cl.
*H01L 29/778* (2006.01)
*H01L 29/66* (2006.01)
(Continued)

(52) U.S. Cl.
CPC .................. *H01L 29/42316* (2013.01); *H01L 29/66462* (2013.01); *H01L 29/7787* (2013.01);
(Continued)

(58) Field of Classification Search
CPC ............. H01L 29/7786; H01L 29/7787; H01L 29/66462
See application file for complete search history.

(56) References Cited

U.S. PATENT DOCUMENTS

2006/0208280 A1* 9/2006 Smith ................. H01L 29/7787
257/E29.093
2012/0175631 A1 7/2012 Lidow et al.
(Continued)

FOREIGN PATENT DOCUMENTS

CN 109817710 A 5/2019
CN 209312774 U 8/2019

OTHER PUBLICATIONS

Koehler, A. "Boron-doped P+ Nanocrystalline Diamond Gate Electrode for AlGaN/GaN HEMTs" CS Mantech Conf. Jan. 2014 pp. 109-112 (Year: 2014).*
(Continued)

*Primary Examiner* — Grant S Withers
(74) *Attorney, Agent, or Firm* — Idea Intellectual Limited; Margaret A. Burke; Sam T. Yip

(57) ABSTRACT

The present disclosure relates to a high electron mobility transistor (HEMT) and a fabrication method thereof. The HEMT may include a substrate; a channel layer disposed on the substrate; a barrier layer disposed on the channel layer; a semiconductor gate disposed on the barrier layer; a metal gate disposed on the semiconductor gate, the metal gate having a trapezoidal cross-sectional shape; and a passivation layer directly contacting the metal gate. A first surface of the metal gate contacts a first surface of the semiconductor gate,
(Continued)

and an edge of the first surface of the metal gate is located inside an edge of the first surface of the semiconductor gate.

23 Claims, 24 Drawing Sheets

(51) Int. Cl.
  *H01L 29/423* (2006.01)
  *H01L 21/285* (2006.01)
  *H01L 21/3213* (2006.01)
  *H01L 29/20* (2006.01)
  *H01L 29/205* (2006.01)

(52) U.S. Cl.
  CPC .............. *H01L 21/28581* (2013.01); *H01L 21/28587* (2013.01); *H01L 21/32136* (2013.01); *H01L 21/32139* (2013.01); *H01L 29/2003* (2013.01); *H01L 29/205* (2013.01)

(56) References Cited

U.S. PATENT DOCUMENTS

| | | | |
|---|---|---|---|
| 2016/0035847 A1 | 2/2016 | Cao et al. | |
| 2018/0248027 A1* | 8/2018 | Okita | .................. H01L 29/1058 |
| 2020/0119178 A1* | 4/2020 | Okita | .................... H01L 29/205 |
| 2020/0350428 A1* | 11/2020 | Tanaka | .............. H01L 29/66462 |
| 2022/0181477 A1* | 6/2022 | Otake | ............... H01L 29/41758 |

OTHER PUBLICATIONS

International Search Report and Written Opinion of the corresponding PCT application No. PCT/CN2019/129379 dated Mar. 24, 2020.
Office Action issued in corresponding China Invention patent application No. 201980005926.0 dated Dec. 21, 2020.
Office Action of the corresponding China patent application No. 201980005926.0 dated Mar. 4, 2022.
Wai-Kai Chen, "Analog and VLSI Circuits Third Edition," National Defense Industry Press 2013, pp. 68-69.

* cited by examiner

HIGH ELECTRON MOBILITY TRANSISTOR AND FABRICATION METHOD THEREOF

BACKGROUND

1. Technical Field

The present disclosure relates to microelectronic field, more particularly to a high electron mobility transistor (HEMT) and a fabrication method thereof.

2. Description of the Related Art

A high electron mobility transistor (HEMT) is a filed effect transistor. A HEMT is different from a metal-oxide-semiconductor (MOS) transistor in that the HEMT adopts two types of materials having different bandgaps that form a heterojunction, and the polarization of the heterojunction forms a two-dimensional electron gas (2DEG) region in the channel layer for providing a channel for the carriers. HEMTs have drawn a great amount of attention due to their excellent high frequency characteristics. HEMTs can operate at high frequencies and thus can be widely used in various mobile devices.

It is discovered in practical applications that the HEMT has a relatively high leakage current and a relatively low gate breakdown voltage, thereby the applications of the HEMT are limited.

SUMMARY OF THE INVENTION

According to some embodiments of the present disclosure, a high electron mobility transistor (HEMT) may include a substrate; a channel layer disposed on the substrate; a barrier layer disposed on the channel layer; a semiconductor gate disposed on the barrier layer; a metal gate disposed on the semiconductor gate, the metal gate having a trapezoidal cross-sectional shape; and a passivation layer directly contacting the metal gate. A first surface of the metal gate contacts a first surface of the semiconductor gate, and an edge of the first surface of the metal gate is located inside an edge of the first surface of the semiconductor gate.

According to some embodiments of the present disclosure, a HEMT may include a substrate; a channel layer disposed on the substrate; a barrier layer disposed on the channel layer; a semiconductor gate disposed on the barrier layer; a metal gate disposed on the semiconductor gate, the metal iu gate having a trapezoidal cross-sectional shape; and a modification layer directly contacting the metal gate. A first surface of the metal gate contacts a first surface of the semiconductor gate, and an edge of the first surface of the metal gate is located inside an edge of the first surface of the semiconductor gate. The modification layer bends at an edge of the first surface of the metal gate.

According to some embodiments of the present disclosure, a method for fabricating a HEMT may include: providing a substrate; forming a channel layer on the substrate; forming a barrier layer on the channel layer; forming a semiconductor gate on the barrier layer; forming a metal gate on the semiconductor gate, wherein the metal gate has a trapezoidal cross-sectional shape, a first surface of the metal gate contacts a first surface of the semiconductor gate, and an edge of the first surface of the metal gate is located inside an edge of the first surface of the semiconductor gate; and forming a passivation layer directly contacting the metal gate.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

PREFERRED EMBODIMENT OF THE PRESENT INVENTION

Figure 1:
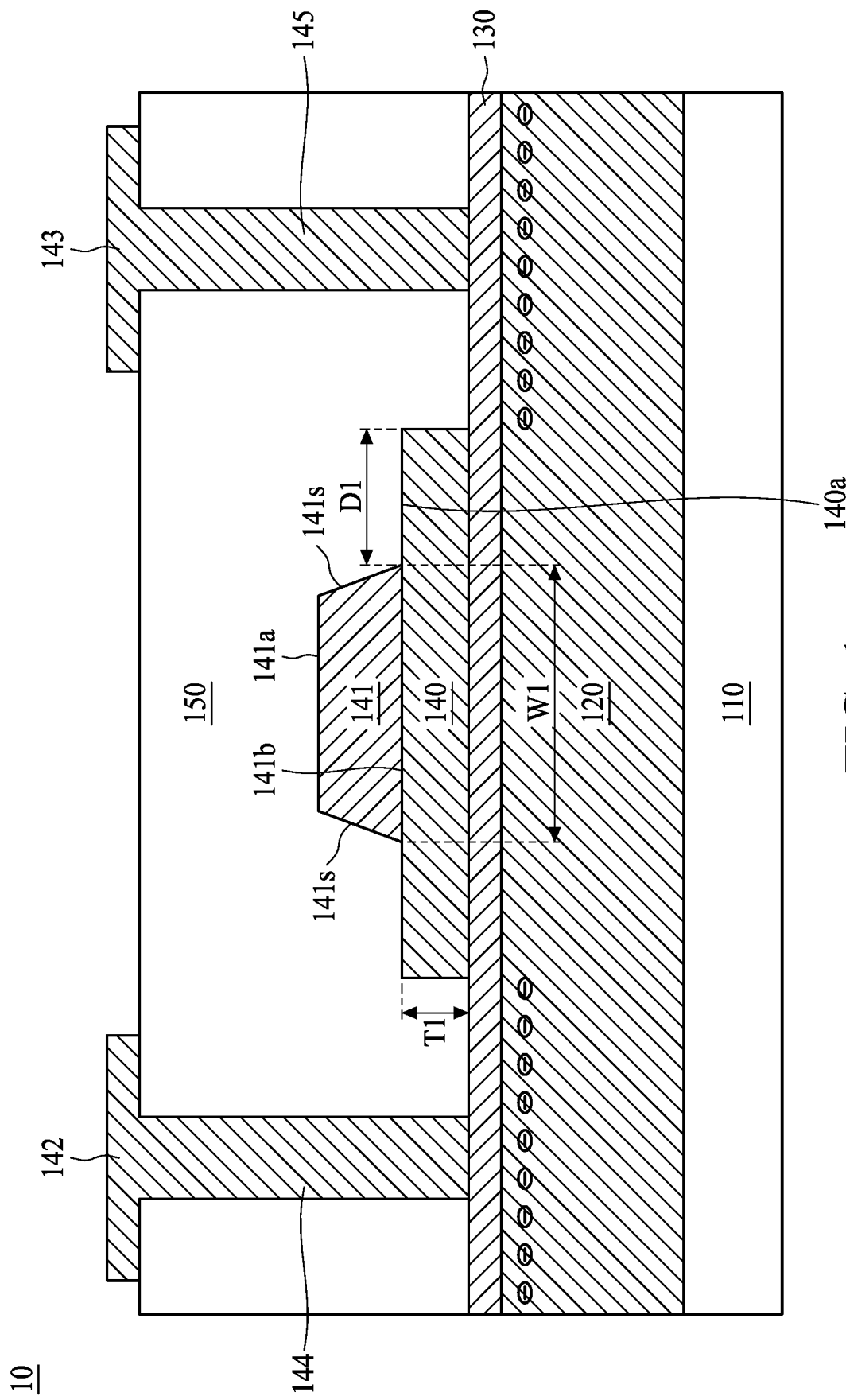
FIG. 1 illustrates a HEMT according to some embodiments of the present disclosure.

Embodiments of the present disclosure are discussed in detail below. It should be appreciated, however, that the present disclosure provides many applicable concepts that can be embodied in a wide variety of specific contexts. It should be appreciated, the following disclosure provides for many different embodiments, or examples, for implementing different features of the provided subject matter. Specific examples of iu components and arrangements are described below. These are, of course, merely examples and are not intended to be limiting.

The following embodiments or examples as illustrated in drawings are described using a specific language. It should be appreciated, however, the specific embodiments discussed are merely illustrative and do not limit the scope of the disclosure. In addition, it should be appreciated by persons having ordinary skills in the art that any changes and/or modifications of the disclosed embodiments as well as any further applications of the principles disclosed herein are encompassed within the scope of the present disclosure.

In addition, the present disclosure may repeat reference numerals and/or letters in the various examples. This repetition is for the purpose of simplicity and clarity and does not in itself dictate a relationship between the various embodiments and/or configurations discussed.

According to at least some embodiments of the present disclosure, a gate includes a semiconductor gate and a metal gate which are stacked. A bottom surface of the metal gate may contact an upper surface of the semiconductor gate, and an edge of the bottom surface of the metal gate may be located inside an edge of the upper surface of the semiconductor gate. Because there is a distance between the edge of the bottom surface of the metal gate and the edge of the upper surface of the semiconductor gate, as the metal gate receives a positive bias voltage, the electrical field at the edge of the semiconductor gate can be reduced. In addition, when a positive bias voltage is applied on the gate, the leakage current path may include not only a height portion at a lateral side of the semiconductor gate but also a portion on the upper surface of the semiconductor gate that is not covered by the metal gate. Therefore, the gate of the HEMT is provided with a relatively longer leakage current path, such that the HEMT can be provided with a relatively low leakage current and a relatively high breakdown voltage.

FIG. 1 illustrates a HEMT 10 according to some embodiments of the present disclosure. The HEMT 10 may include a substrate 110, a channel layer 120, a barrier layer 130, a semiconductor gate 140, a metal gate 141, a passivation layer 150, a source 142 and a drain 143. The semiconductor gate 140 and the metal gate 141 may form the gate of the HEMT 10.

The substrate 110 may include, for example but not limited to, silicon (Si), doped Si, silicon carbide (SiC), germanium silicide (SiGe), gallium arsenide (GaAs), or other semiconductor materials. The substrate 110 may include, for example but not limited to, sapphire, silicon on insulator (SOI), or other suitable materials. In some embodiments, the substrate 110 may include a silicon material. In some embodiments, the substrate 110 may be a silicon substrate.

The channel layer 120 may be disposed on the substrate 110. In some embodiments, the channel layer 120 may include a group III-V layer. The channel layer 120 may include, for example but not limited to, group III nitride, for example, a compound $Al_yGa_{(1-y)}N$, in which $y \le 1$. In some embodiments, the channel layer 120 may include GaN.

The barrier layer 130 may be disposed on the channel layer 120. In some embodiments, the barrier layer 130 may include a group III-V layer. The barrier layer 130 may include, for example but not limited to, group III nitride, for example, a compound $Al_yGa_{(1-y)}N$, in which $y \le 1$. The barrier layer 130 may have a bandgap that is greater than that of the channel layer 120. In some embodiments, a material of the barrier layer 130 may include AlGaN. In some embodiments, a material of the barrier layer 130 may include undoped AlGaN.

A heterojunction may be formed between the barrier layer 130 and the channel 120. The polarization of the heterojunction of different nitrides forms a two-dimensional electron gas (2DEG) region in the channel layer 120. The 2DEG region is usually formed in the layer that has a lower bandgap (e.g., GaN). The channel layer 120 may provide electrons to or remove electrons from the 2DEG region, so as to control the conduction of the HEMT 10.

The semiconductor gate 140 may be disposed on the barrier layer 130. In some embodiments, the semiconductor gate 140 may include a group III-V layer. The semiconductor gate 140 may include, for example but not limited to, group III nitride, for example, a compound $Al_yGa_{(1-y)}N$, in which $y \le 1$. In some embodiments, a material of the semiconductor gate 140 may include a p-type doped group III-V layer. In some embodiments, a material of the semiconductor gate 140 may include p-type doped GaN.

The metal gate 141 may be disposed on the semiconductor gate 140. A bottom surface (i.e., surface 141b) of the metal gate 141 may contact an upper surface (i.e., surface 140a) of the semiconductor gate 140, and an edge of the bottom surface (i.e., surface 141b) of the metal gate 141 may be located inside an edge of the upper surface (i.e., surface 140a) of the semiconductor gate 140. Because there is a distance between the edge of the bottom surface (i.e., surface 141b) of the metal gate 141 and the edge of the upper surface (i.e., surface 140a) of the semiconductor gate 140, as the metal gate 141 receives a positive bias voltage, the electrical field at the edge of the semiconductor gate 140 can be reduced.

In addition, when a positive bias voltage is applied on the gate, a relatively high electrical field may be generated at the edge of the metal gate 141, so as to form a leakage current. The leakage current path includes the distance from the edge where the metal gate 141 contacts the semiconductor gate 140 to the barrier layer 130. According to some embodiments of the present disclosure, the leakage current path may include not only the height (i.e., the thickness T1 of the semiconductor gate 140) portion at the lateral side of the semiconductor gate 140 but also the portion on the upper surface (i.e., surface 140a) of the semiconductor gate 140 that is not covered by the metal gate 141. Therefore, the gate of the HEMT 10 is provided with a relatively longer leakage current path. According to some embodiments of the present disclosure, the electrical field at the edge of the semiconductor gate 140 can be reduced, and the leakage current path of the gate can be increased. Therefore, the HEMT 10 can be provided with a relatively low leakage current and a relatively high breakdown voltage. In some embodiments, the HEMT 10 shown in FIG. 1 may have a breakdown voltage of about 8V or higher.

In some embodiments, as shown in FIG. 1, the edge of the surface 141b of the metal gate 141 may be separated from the edge of the surface 140a of the semiconductor gate 140 by an indent distance D1. In some embodiments, a ratio (D1/W1) of the indent distance D1 to a width W1 of the metal gate 141 may be in a range from about 0.2 to about 0.65. In some embodiments, the ratio (D1/W1) of the indent distance D1 to the width W1 of the metal gate 141 may be in a range from about 0.25 to about 0.6.

In some embodiments, as shown in FIG. 1, a ratio (D1/T1) of the indent distance D1 between the edge of the surface 141b of the metal gate 141 and the edge of the surface 140a of the semiconductor gate 140 to a thickness T1 of the semiconductor gate 140 may be in a range from about 3 to about 7. In some embodiments, the ratio (D1/T1) of the indent distance D1 to the thickness T1 of the semiconductor gate 140 may be in a range from about 3.5 to about 6.5. In some embodiments, the ratio (D1/T1) of the indent distance D1 to the thickness T1 of the semiconductor gate 140 may be in a range from about 4 to about 6.

According to some embodiments of the present disclosure, when the ratio (D1/T1) of the indent distance D1 to the thickness T1 of the semiconductor gate 140 is within the critical ranges of, for example, from about 3 to about 7, or from about 3.5 to about 6.5, or from about 4 to about 6, the leakage current path may be elongated significantly from only covering the height portion at the lateral side of the semiconductor gate 140 to further covering the portion on the upper surface (i.e., surface 140a) of the semiconductor gate 140 that is not covered by the metal gate 141 (i.e., the indent distance D1, which is 3 to 7 times the thickness T1, or 3.5 to 6.5 times the thickness T1, or 4 to 6 times the thickness T1). In other words, the length of the leakage current path increases from the length that equals the thickness T1 of the metal gate 141 to the length that equals the sum of the thickness T1 and the indent distance D1, which is significantly increased to 4 to 8 times the thickness T1, or 4.5 to 7.5 times the thickness T1, or 5 to 7 times the thickness T1. Therefore, the length of the leakage current path is increased to 4 to 8 times the original length, or 4.5 to 7.5 times the original length, or 5 to 7 times the original length, thus the leakage current can be reduced and the breakdown voltage can be increased effectively.

In some embodiments, as shown in FIG. 1, the metal gate 141 may have a trapezoidal cross-sectional shape. In some embodiments, a cross-sectional width of the metal gate 141 decreases towards a direction away from the semiconductor gate 140.

In some embodiments, as shown in FIG. 1, a sidewall 141s of the metal gate 141 extends towards a direction away from the surface 141b of the metal gate 141, a sidewall 140s of the semiconductor gate 140 extends towards the surface 140a of the semiconductor gate 140, and a slope of the sidewall 140s of the semiconductor gate 140 may be less than a slope of the sidewall 141s of the metal gate 141.

In some embodiments, the metal gate 141 may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The passivation layer 150 may directly contact the metal gate 141. In some embodiments, the passivation layer 150 may directly contact the sidewall 141s and the upper surface 141a of the metal gate 141. In some embodiments, the passivation layer 150 may include, for example but not limited to, oxides and/or nitrides, such as silicon nitride (SiN) and/or silicon oxide ($SiO_2$). In some embodiments, the passivation layer 150 may include silicon nitride and/or silicon oxide formed by a non-plasma film formation process.

In some embodiments, as shown in FIG. 1, the HEMT 10 may further include a source 142 and a drain 143 disposed on the passivation layer 150. The source 142 may be connected to the barrier layer 130 through a source through via 144 in the passivation layer 150, and the drain 143 may be connected to the barrier layer 130 through a drain through via 145 in the passivation layer 150. Although the source 142 and the drain 143 are disposed on two sides of the semiconductor gate 140 and the metal gate 141 as shown in FIG. 1, the source 142, the drain 143, the semiconductor gate 140 and the metal gate 141 may be arranged differently in other embodiments of the present disclosure according to design needs.

In some embodiments, the source 142 and the drain 143 may independently include, for example, but are not limited to, metals, alloys, doped semiconductor materials (e.g., doped crystalline silicon), or other suitable conductor materials.

In some embodiments, the HEMT 10 may be an enhancement mode device. The enhancement mode device is preset in an OFF-state when the gate is at zero bias. When a voltage is applied to the gate (metal gate 141), electrons or charges are induced in the region below the gate, and this region may be referred to as an electron or charge inversion layer. When the voltage increases, the number of induced electrons or charges increases as well.

Figure 2:
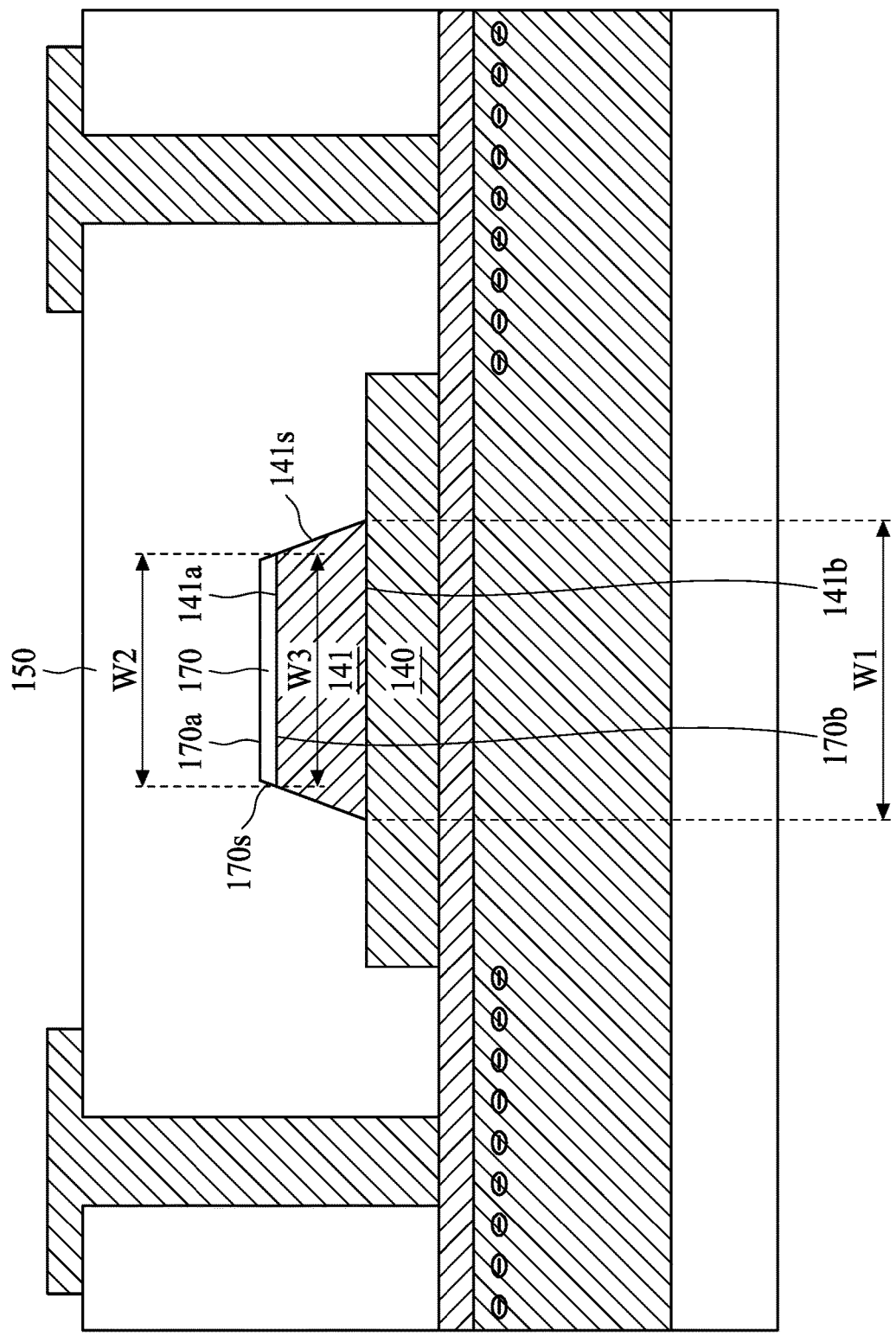
FIG. 2 illustrates a HEMT according to some embodiments of the present disclosure.

FIG. 2 illustrates a HEMT 20 according to some embodiments of the present disclosure. The HEMT 20 is similar to the HEMT 10 shown in FIG. 1, and the differences will be discussed hereinafter.

In some embodiments, as shown in FIG. 2, the HEMT 20 may further include a hardmask 170 disposed on the metal gate 141.

In some embodiments, a bottom surface (i.e., surface 170b) of the hardmask 170 faces towards the metal gate 141, and an upper surface (i.e., surface 170a) of the hardmask 170 is opposite to the bottom surface (i.e., surface 170b). The bottom surface (i.e., surface 170b) of the hardmask 170 may directly contact the metal gate 141. In some embodiments, as shown in FIG. 2, a width W2 of the bottom surface (i.e., surface 170b) of the hardmask 170 may be less than a width W1 of the bottom surface (i.e., surface 141b) of the metal gate 141. In some embodiments, as shown in FIG. 2, the width W2 of the bottom surface (i.e., surface 170b) of the hardmask 170 may be substantially equal to a width W3 of the upper surface (i.e., surface 141a) of the metal gate 141.

In some embodiments, a sidewall 170s of the hardmask 170 may extend toward a direction away from the surface 170b of the hardmask 170, and the passivation layer 150 may directly contact the sidewall 170s and the upper surface (i.e., surface 170a) of the hardmask 170. In some embodiments, the hardmask 170 may include, for example but not limited to, oxides and/or nitrides, such as silicon nitride (SiN) and/or silicon oxide ($SiO_2$).

In some embodiments, the HEMT 20 shown in FIG. 2 may have a breakdown voltage of about 8V or higher.

Figure 3:
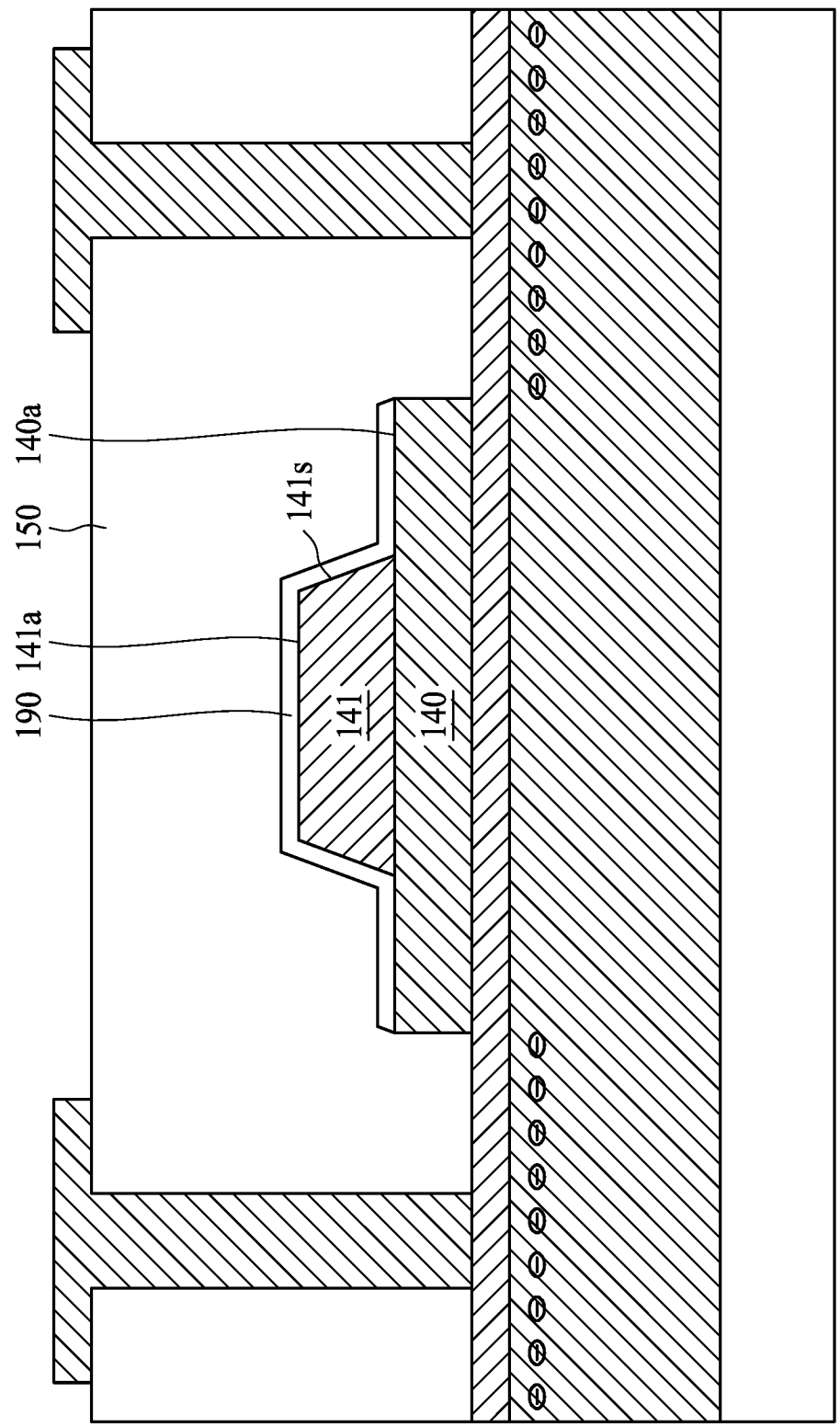
FIG. 3 illustrates a HEMT according to some embodiments of the present disclosure.

FIG. 3 illustrates a HEMT 30 according to some embodiments of the present disclosure. The HEMT 30 is similar to the HEMT 10 shown in FIG. 1, and the differences will be discussed hereinafter.

In some embodiments, as shown in FIG. 3, the HEMT 30 may further include a modification layer 190. The modification layer 190 may directly contact the metal gate 141. The modification layer 190 may be advantageous to reducing the surface defects of the metal gate 141, and thus is advantageous to the electronic performance of the HEMT 30.

In some embodiments, the modification layer 190 may directly contact the sidewall 141s of the metal gate 141. In some embodiments, the modification layer 190 may directly contact and fully cover the whole sidewall 141s of the metal gate 141. In some embodiments, the modification layer 190 may directly contact the upper surface 141a of the metal gate 141. In some embodiments, the modification layer 190 may directly contact and fully cover the whole upper surface 141a of the metal gate 141. In some embodiments, the modification layer 190 may directly contact the upper surface 140a of the semiconductor gate 140. In some embodiments, the modification layer 190 may conformally extend along the sidewall 141s of the metal gate 141 towards the upper surface 140a of the semiconductor gate 140. In some embodiments, the modification layer 190 may bend at the edge of the surface 141b of the metal gate 141. In some embodiments, the modification layer 190 may conformally extend upwardly along the sidewall 141s of the metal gate 141 towards the upper surface 141a of the metal gate 141 and then downwardly towards the sidewall 141s on the other side of the metal gate 141. In some embodiments, the modification layer 190 may have a substantially uniform thickness. In some embodiments, the modification layer 190 may have a thickness of, for example, equal to or smaller than 20 μm. In some embodiments, the thickness of the modification layer 190 may be, for example, in a range from about 1 µm to about 20 µm, or in a range from about 3 µm to about 15 µm, or in a range from about 5 µm to about 10 µm.

In some embodiments, the modification layer 190 may include aluminum oxide, aluminum nitride, and/or silicon nitride formed by a non-plasma film formation process. By using silicon nitride formed by a non-plasma film formation process to form the modification layer 190, the damage to the surface of the metal gate 141, such as the sidewall 141s of the metal gate 141, by a plasma process may be prevented, and thus the smooth surface profile of the metal gate 141 can be nicely maintained, and/or the surface defects of the metal gate 141 can be reduced.

In some embodiments, the HEMT 30 shown in FIG. 3 may have a breakdown voltage of about 8V or higher.

Figure 4:
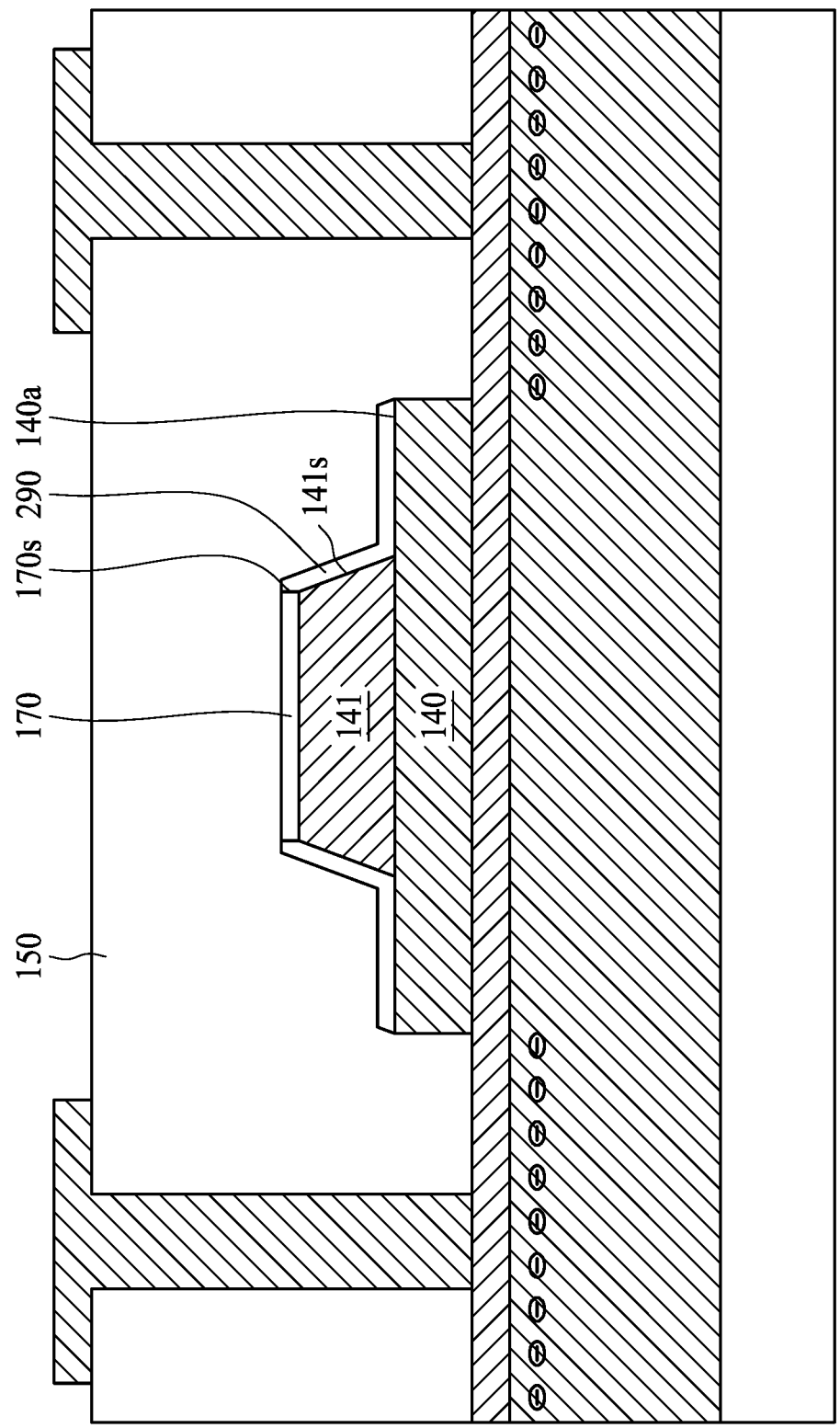
FIG. 4 illustrates a HEMT according to some embodiments of the present disclosure.

FIG. 4 illustrates a HEMT 40 according to some embodiments of the present disclosure. The HEMT 40 is similar to the HEMT 20 shown in FIG. 2, and the differences will be discussed hereinafter.

In some embodiments, as shown in FIG. 4, the HEMT 40 may further include a modification layer 290 disposed on the sidewall 141s of the metal gate 141. The modification layer 290 may directly contact the metal gate 141. The modification layer 290 is advantageous to reducing the surface defects of the metal gate 141, and thus is advantageous to the electronic performance of the HEMT 40.

In some embodiments, the modification layer 290 may directly contact the sidewall 170s of the hardmask 170. In some embodiments, the modification layer 290 may include aluminum oxide, aluminum nitride, and/or silicon nitride formed by a non-plasma film formation process.

In some embodiments, the HEMT 40 shown in FIG. 4 may have a breakdown voltage of about 8V or higher.

Figure 5:
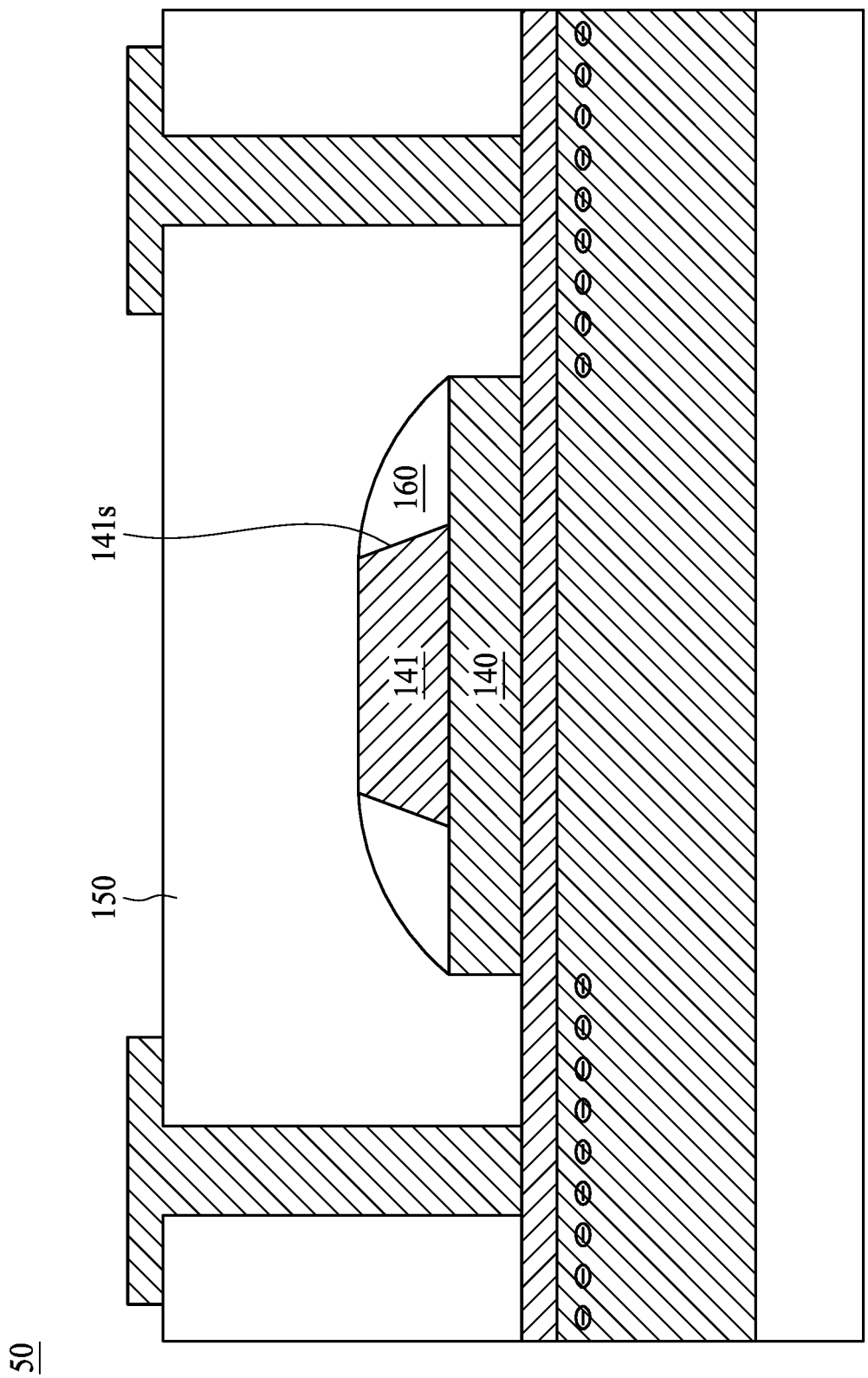
FIG. 5 illustrates a HEMT according to some embodiments of the present disclosure.

FIG. 5 illustrates a HEMT 50 according to some embodiments of the present disclosure. The HEMT 50 is similar to the HEMT 10 shown in FIG. 1, and the differences will be discussed hereinafter.

In some embodiments, as shown in FIG. 5, the HEMT 50 may further include an insulating spacer 160 disposed on the semiconductor gate 140 and directly contacting the sidewall 141s of the metal gate 141. In some embodiments, the insulating spacer 160 may include, for example but not limited to, silicon oxide, silicon nitride, or other suitable inorganic insulating materials. In some embodiments, the insulating spacer 160 may include silicon oxide, silicon nitride, or other suitable inorganic insulating materials formed by a plasma film formation process.

In some embodiments, since the insulating spacer 160 directly contacts the sidewall 141s of the metal gate 141, the presence of the insulating spacer 160 may cause trapping of additional electrons, thereby affecting the electronic performance of the HEMT. In some embodiments, the HEMT 50 shown in FIG. 5 may have a breakdown voltage of about 4V.

Figure 6:
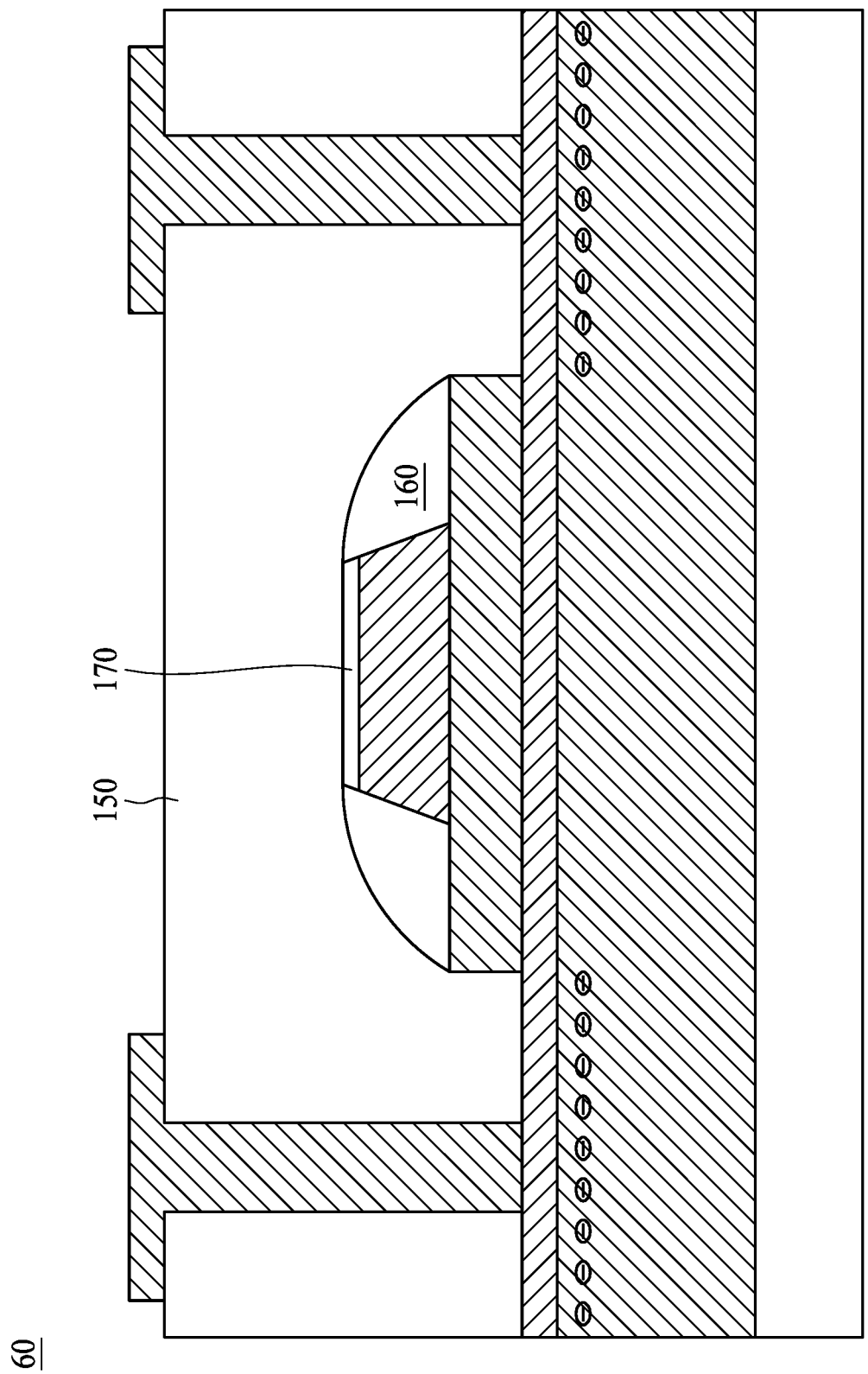
FIG. 6 illustrates a HEMT according to some embodiments of the present disclosure.

FIG. 6 illustrates a HEMT 60 according to some embodiments of the present disclosure. The HEMT 60 is similar to the HEMT 20 shown in FIG. 2, and the differences will be discussed hereinafter.

In some embodiments, as shown in FIG. 6, the HEMT 60 may further include an insulating spacer 160 disposed on the semiconductor gate 140 and directly contacting the sidewall 141s of the metal gate 141. The insulating spacer 160 may directly contact the sidewall 170s of the hardmask 170.

In some embodiments, since the insulating spacer 160 directly contacts the sidewall 141s of the metal gate 141 and the sidewall 170s of the hardmask 170, the presence of the insulating spacer 160 may cause trapping of additional electrons, thereby affecting the electronic performance of the HEMT. In some embodiments, the HEMT 60 shown in FIG. 6 may have a breakdown voltage of about 4V.

Table 1 below lists relationships between sizes of components, leakage currents, and breakdown voltages of various HEMTs according to some embodiments of the present disclosure. The following embodiments 1-9 adopt the HEMT 10 shown in FIG. 1 as examples. It should be noted that the following embodiments are merely used for illustrating the present disclosure and do not limit the scope of the present disclosure.

TABLE 1

| | Width W1 of metal gate (µm) | Indent distance D1 (µm) | D1/W1 | Conduction resistance (Ron) (mΩ) | Leakage current (@ 6 V) (A) | Breakdown voltage (V) |
|---|---|---|---|---|---|---|
| Embodiment 1 | 500 | 140 | 0.28 | 28 | 5.00E-06 | 7.2 |
| Embodiment 2 | 500 | 170 | 0.34 | 30 | 3.00E-06 | 7.5 |
| Embodiment 3 | 500 | 200 | 0.40 | 32 | 1.20E-07 | 8.8 |
| Embodiment 4 | 500 | 230 | 0.46 | 40 | 1.00E-07 | 9 |
| Embodiment 5 | 500 | 260 | 0.52 | 50 | 1.00E-07 | 9 |
| Embodiment 6 | 500 | 60 | 0.12 | 23 | 1.05E-05 | 5.9 |
| Embodiment 7 | 500 | 80 | 0.16 | 24 | 7.60E-06 | 6.4 |
| Embodiment 8 | 500 | 360 | 0.72 | 90 | 9.6E-08 | 9.1 |
| Embodiment 9 | 500 | 380 | 0.76 | 115 | 1.01E-07 | 8.9 |

The results in table 1 show that when the indent distance D1 between the edge of the bottom surface (surface 141b) of the metal gate 141 and the edge of the upper surface (surface 140a) of the semiconductor gate 140 is increased, the leakage current may be decreased accordingly, and the breakdown voltage may be increased accordingly. However, the distance (indent distance D1) between the edge of the metal gate 141 and the edge of the semiconductor gate 140 being too large may cause the reduction of the electronic field, which is not a benefit to effectively forming the 2DEG. This is reflected by the increase of the gate conduction resistance, which may worsen the control ability over the gate. In contrast, when the indent distance D1 between the edge of the bottom surface (surface 141b) of the metal gate 141 and the edge of the upper surface (i.e., surface 140a) of the semiconductor gate 140 is decreased, despite that the gate conduction resistance is reduced and the control ability over the gate is improved, the leakage current may be increased, and the breakdown voltage may be decreased.

According to the results in table 1 above, as the results of the conduction resistance, the leakage current, and the breakdown voltage are considered as a whole, it shows that when a ratio (D1/W1) of the indent distance D1 to the width W1 of the metal gate 141 is, for example, in a critical range from about 0.2 to about 0.65, or in a critical range from about 0.28 to about 0.52, or in a critical range from about 0.34 to about 0.46, the HEMT having an extraordinary overall performance can be obtained.

FIGS. 7A, 7B, 7C, 7D, 7E, 7F and 7G illustrate a method for fabricating a HEMT 10 according to some embodiments of the present disclosure.

Figure 7A:
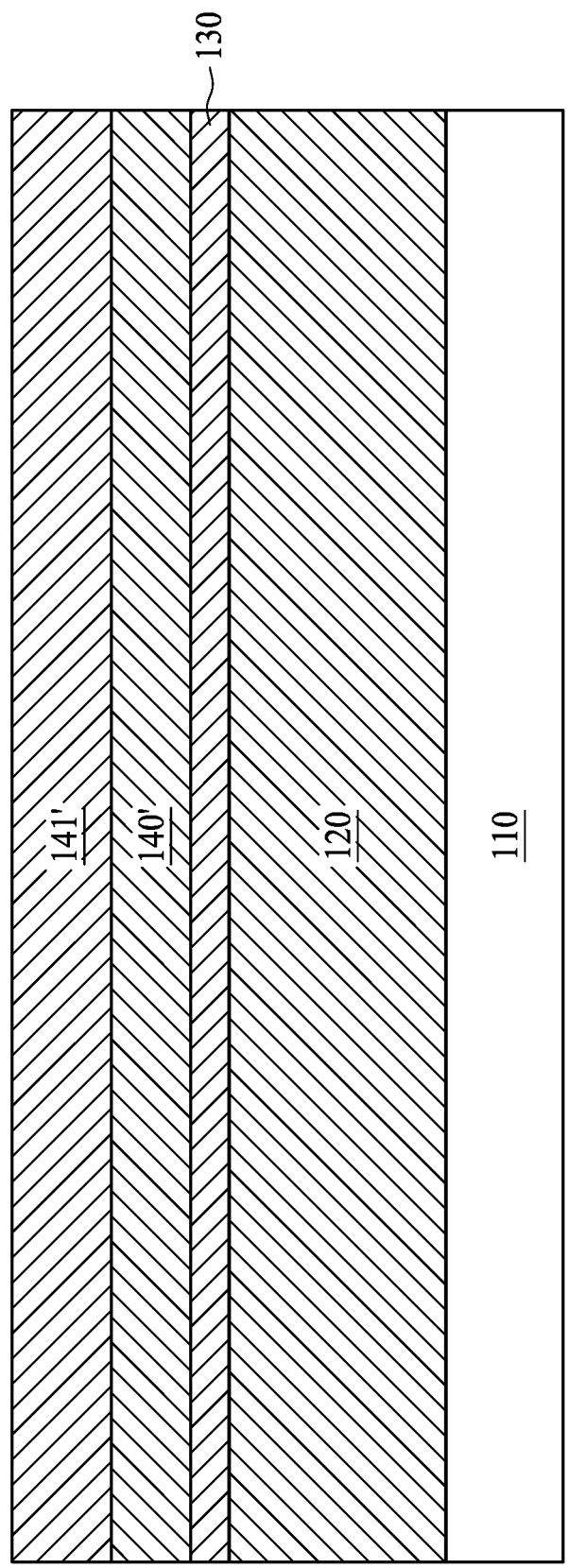
FIGS. 7A, 7B, 7C, 7D, 7E, 7F and 7G illustrate a method for fabricating a HEMT according to some embodiments of the present disclosure.

Referring to FIG. 7A, a substrate 110 is provided. In some embodiments, the substrate 110 may include a silicon material. Next, a channel layer 120 is formed on the substrate 110, a barrier layer 130 is formed on the channel layer 120, and a semiconductor gate material layer 140' is formed on the barrier layer 130. In some embodiments, a material of the channel layer 120 may include GaN, a material of the barrier layer 130 may include AlGaN, and a material of the semiconductor gate material layer 140' may include GaN. Then, a metal gate material layer 141' is formed on the semiconductor gate material layer 140'. In some embodiments, a material of the metal gate material layer 141' may include TiN. In some embodiments, the channel layer 120, the barrier layer 130, and/or the semiconductor gate material layer 140' may be formed by chemical vapor deposition (CVD), physical vapor deposition (PVD), epitaxial growth, or other suitable deposition processes. In some embodiments, one or more layers of materials may be deposited by PVD, CVD, and/or other suitable processes to form the metal gate material layer 141'. In some embodiments, the metal gate material layer 141' may be formed by sputtering or evaporating a metal material on the semiconductor gate material layer 140'.

Figure 7B:
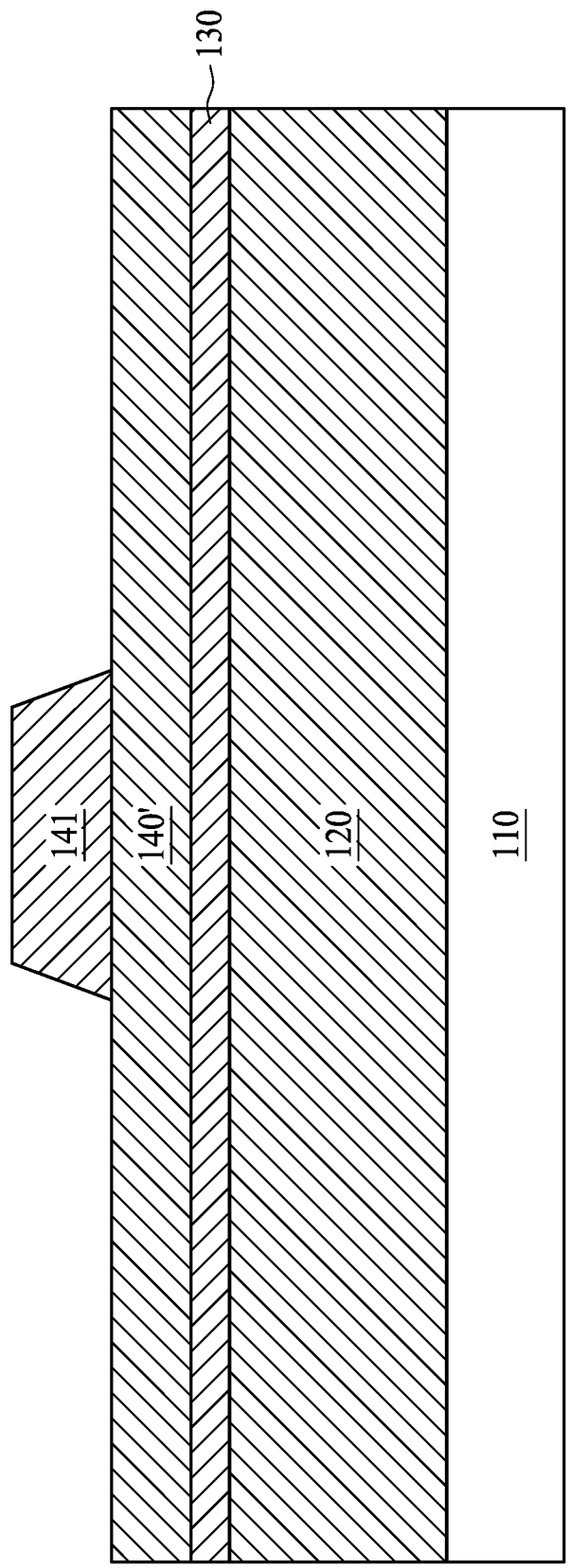

Referring to FIG. 7B, a patterning process may be performed on the metal gate material layer 141' to form a metal gate 141. In some embodiments, the metal gate material layer 141' may be patterned by wet etching, and the metal gate material layer 141' may be patterned by dry etching as well. In some embodiments, a lift-off process may be performed to partially remove the metal gate material layer 141' to form a metal gate 141 having a trapezoidal cross-sectional shape. For example, a photoresist pattern may be formed on the semiconductor gate material layer 140' before forming the metal gate material layer 141', and the photoresist pattern has one or more openings to partially expose the semiconductor gate material layer 140'. Next, the metal gate material layer 141' is formed on the photoresist pattern and the exposed portion of the semiconductor gate material layer 140'. Next, a solvent may be used to remove the photoresist pattern on the semiconductor gate material layer 140'. Portions of the metal gate material layer 141' on the photoresist pattern are dissolved in the solvent and removed along with the photoresist pattern, and portions of the metal gate material layer 141' that are not removed and located on the exposed portion of the semiconductor gate material layer 140' remain so as to form the metal gate 141.

Figure 7C:
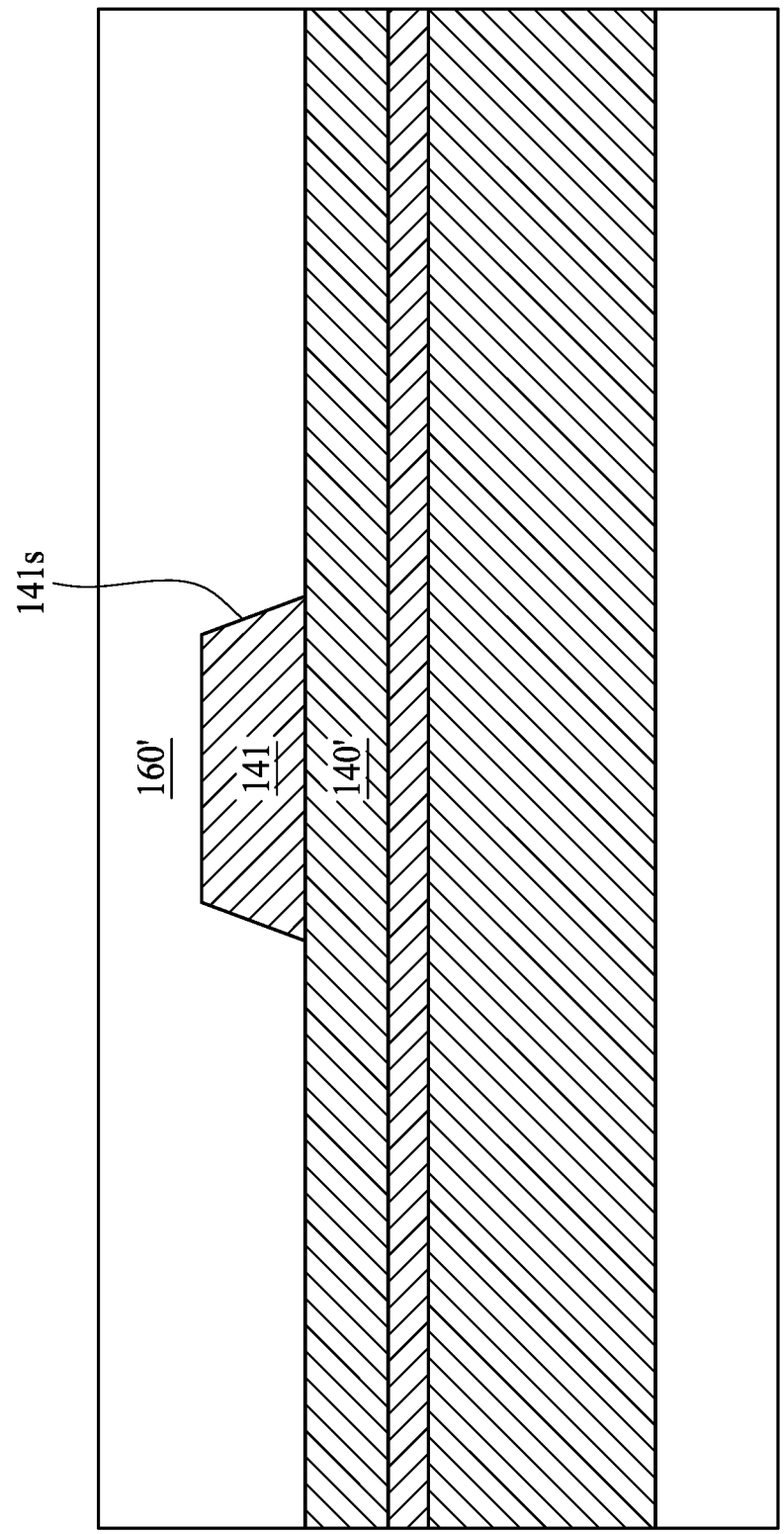

Referring to FIG. 7C, an insulating spacer material layer 160' is formed on the semiconductor gate material layer 140'. The insulating spacer material layer 160' may directly contact the sidewall 141s of the metal gate 141. In some embodiments, the insulating spacer material layer 160' may directly contact and fully cover the whole sidewall 141s of the metal gate 141. In some embodiments, the insulating spacer material layer 160' may be formed on the semiconductor gate material layer 140' by plasma enhanced CVD (PECVD). By using the plasma process, the insulating spacer 160 formed subsequently can be provided with improved properties when being used as a self-aligned mask.

Figure 7D:
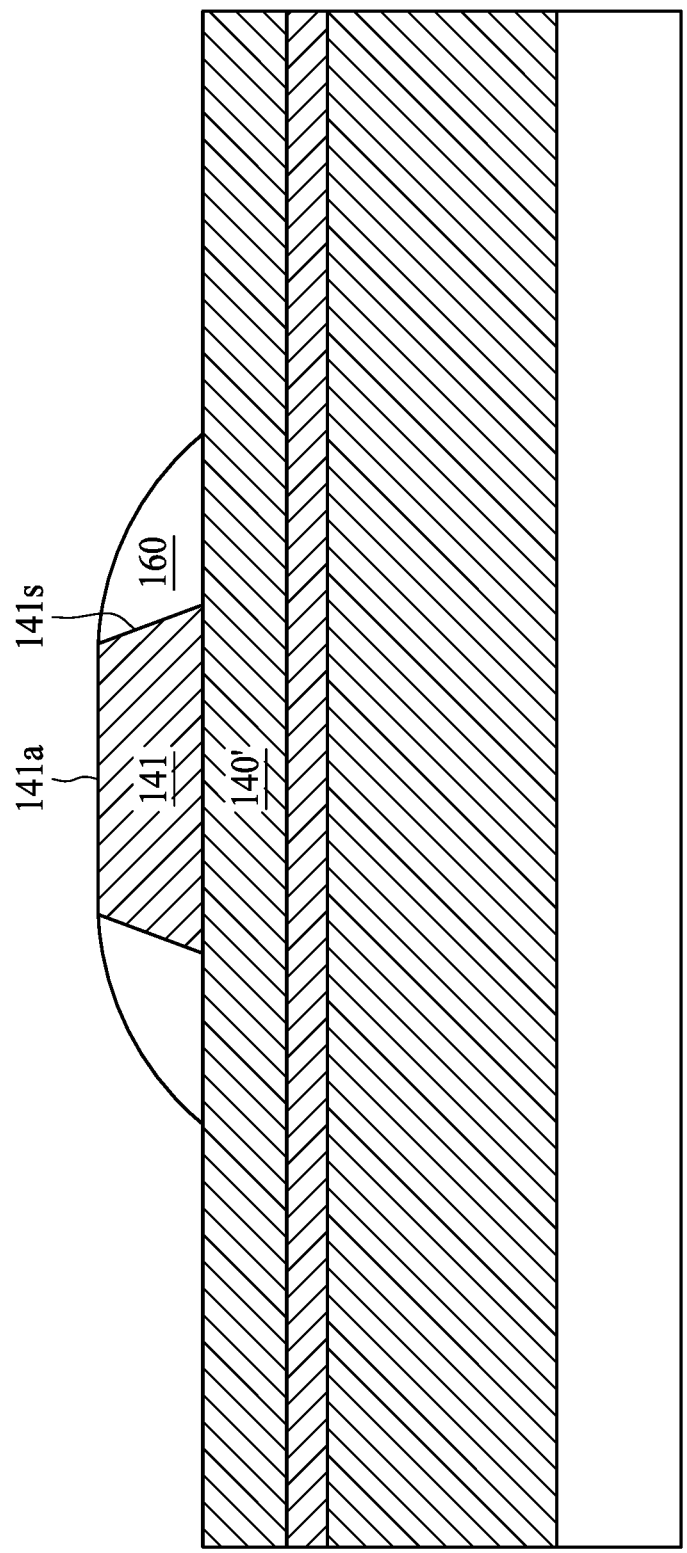

Referring to FIG. 7D, a patterning process may be performed on the insulating spacer material layer 160' to form the insulating spacer 160. In some embodiments, the insulating spacer 160 may be formed on the semiconductor gate material layer 140' and surround the metal gate 141. In some embodiments, an anisotropic etching process may be performed to partially remove the insulating spacer material layer 160' to form the insulating spacer 160. In some embodiments, the insulating spacer material layer 160' is made of an inorganic material, and it requires using a plasma etching process to form the insulating spacer 160. In some embodiments, the insulating spacer 160 may directly contact the sidewall 141s of the metal gate 141. In some embodiments, the insulating spacer 160 may directly contact and fully cover the whole sidewall 141s of the metal gate 141.

Figure 7E:
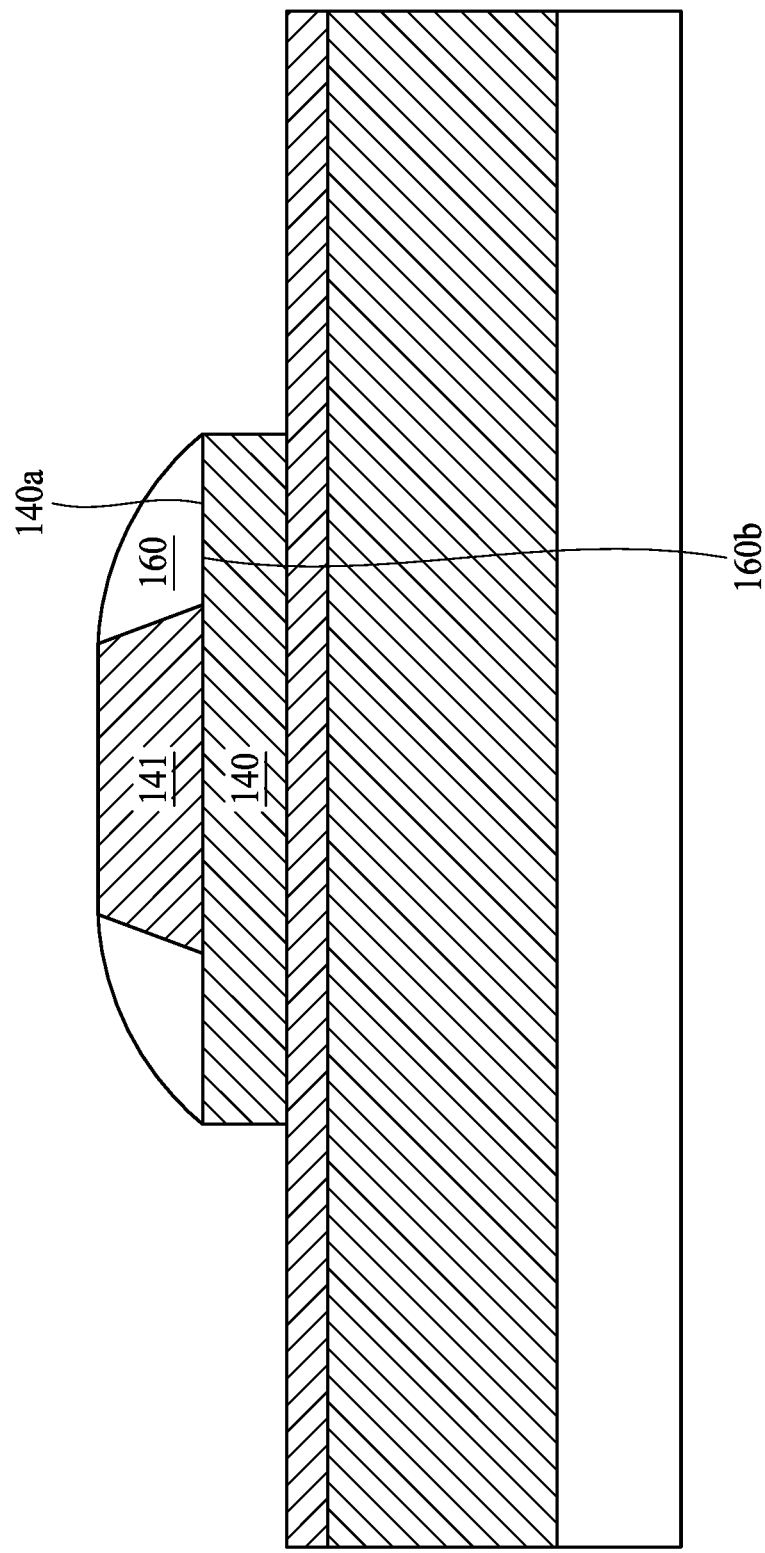

Referring to FIG. 7E, the combination of the metal gate 141 and the insulating spacer 160 may be used as a self-aligned mask to pattern the semiconductor gate material layer 140' to form the semiconductor gate 140. In some embodiments, the metal gate 141 and the insulating spacer 160 may be used as a self-aligned mask to perform an etching process, e.g., an anisotropic etching process, on the semiconductor gate material layer 140' to form the semiconductor gate 140. As shown in FIG. 7E, the edge of the upper surface (i.e., surface 140a) of the semiconductor gate 140 may be aligned with the outer edge of the bottom surface (i.e., surface 160b) of the insulating spacer 160.

Figure 7F:
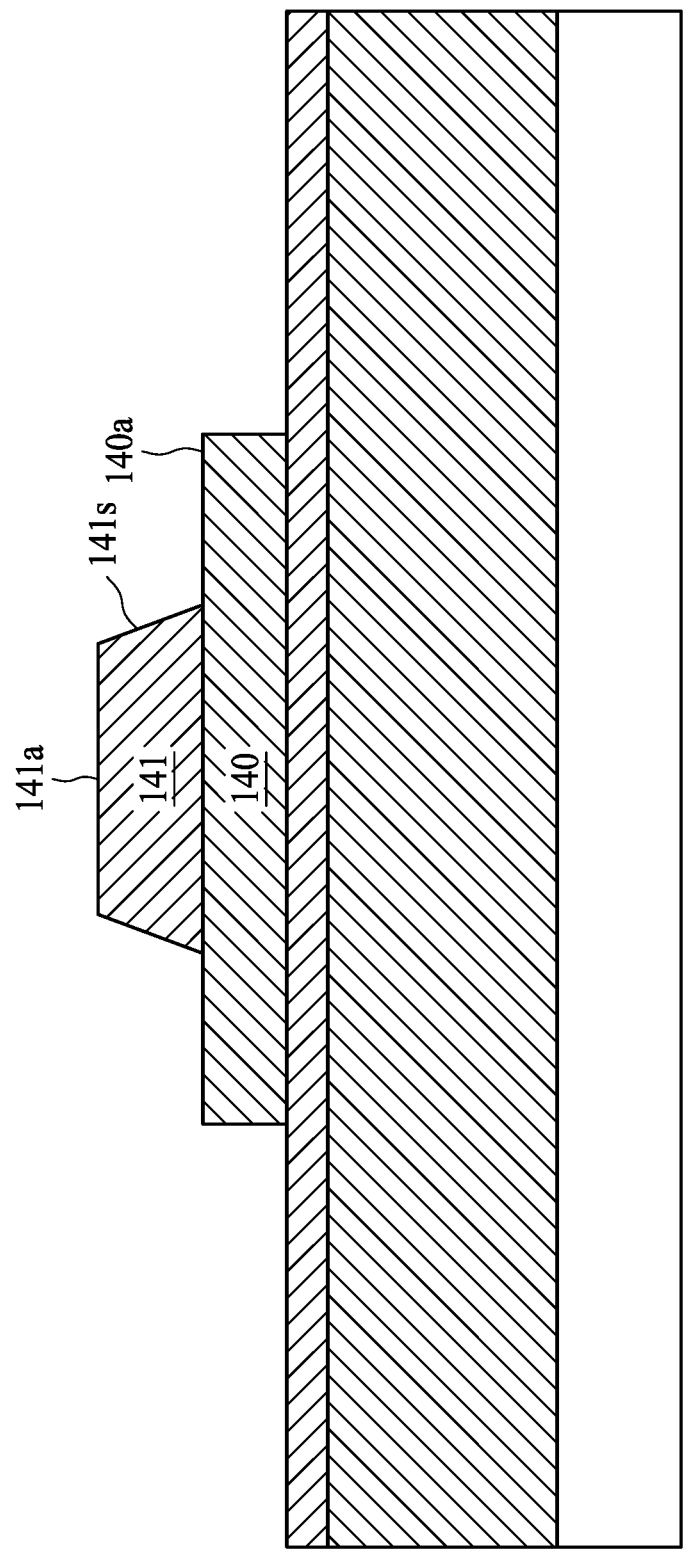

Referring to FIG. 7F, the insulating spacer 160 is removed. In some embodiments, a cleaning solution including hydrofluoric acid (HF), e.g., a hydrofluoric acid aqueous solution, may be used to etch and remove the insulating spacer 160. In some embodiments, after the insulating spacer 160 is removed, another cleaning solution including a different composition may be used to etch and clean off the native oxides on the sidewall 141s of the metal gate 141. In some embodiments, this another cleaning solution including a different composition may be a cleaning solution including hydrochloric acid (HCl), for example, a hydrochloric acid aqueous solution.

According to some embodiments of the present disclosure, the insulating spacer 160 may be disposed to be used as a self-aligned mask for etching the semiconductor gate material layer 140', and it may protect the sidewall 141s of the metal gate 141 from being damaged by the etchants in the etching process of the semiconductor gate material layer 140'. Therefore, disposing the insulating spacer 160 in the intermediate stages of the manufacturing process is advantageous to protecting the surface profile of the metal gate 141, and removing the insulating spacer 160 subsequently may leave the metal gate 140 with a relatively smooth surface profile, for example, the sidewall 141s of the metal gate 141 may have a relatively smooth surface profile. Thereby, the tip discharge or charge accumulation that may be easily caused by rough surface structures can be prevented, and thus the as-formed HEMT can be provided with excellent electrical performance.

Figure 7G:
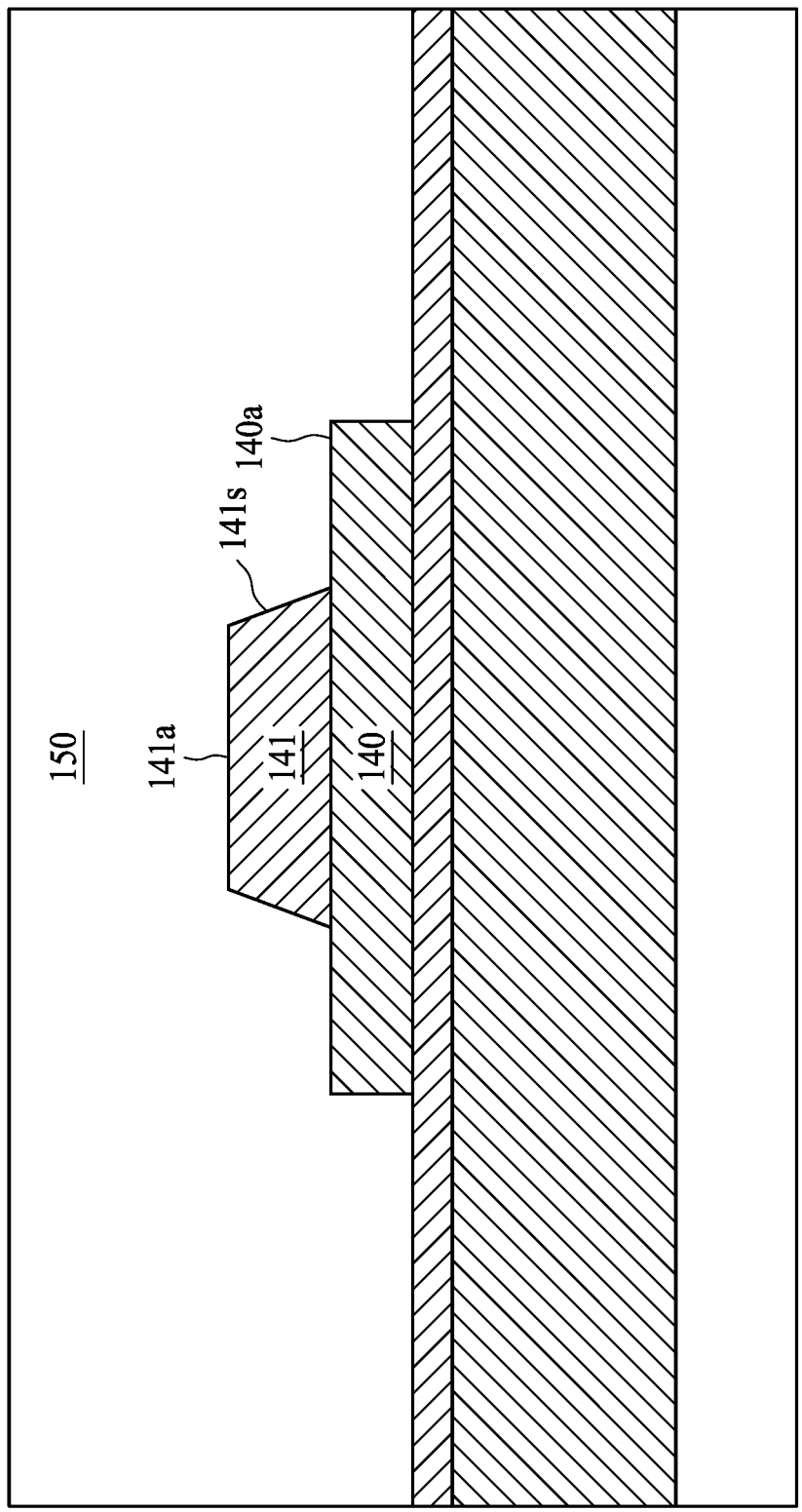

Referring to FIG. 7G, a passivation layer 150 is formed. In some embodiments, the passivation layer 150 directly contacts the metal gate 141. The passivation layer 150 may directly contact the whole sidewall 141s and the upper surface 141a. In some embodiments, the passivation layer 150 may directly contact a portion of the upper surface (i.e., surface 140a) that is not covered by the metal gate 141. In some embodiments, the passivation layer 150 may be formed by CVD, spin-on, sputtering, and/or other suitable non-plasma film formation processes. In some embodiments, using a non-plasma film formation process to form the passivation layer 150 is advantageous to preventing the surface profile of the metal gate 141 from being damaged by plasma, and the as-formed passivation layer 150 can further protect the smooth surface profile of the metal gate 141, for example, the sidewall 141s of the metal gate 141. Thereby, the tip discharge or charge accumulation that may be easily caused by rough surface structures can be prevented, and thus the as-formed HEMT can be provided with excellent electrical performance.

Next, referring to FIG. 1, a source through via 144 and a drain through via 145 may be formed to penetrate through the passivation layer 150, and a source 142 and a drain 143 are formed on the passivation layer 150. The source 142 may be connected to the barrier layer 130 through the source through via 144, and the drain 143 may be connected to the barrier layer 130 through the drain through via 145. In some embodiments, a portion of the passivation layer 150 may be removed by one or more etching processes to form openings. After the openings are formed, a conductive material may be filled in the openings by a deposition process such as CVD, PVD, electroplating and/or sputtering, to form the source through via 144 and the drain through via 145. In some embodiments, after the conductive material is filled in the openings, another etching process may be further performed on the deposited conductive material according to a photomask to form the structures of the source 142 and the drain 143. As such, the HEMT 10 shown in FIG. 1 is formed.

In some other embodiments, referring to FIG. 3 and FIG. 7F, a modification layer 190 may be formed on the sidewall 141s of the metal gate 141 after the insulating spacer 160 is removed and before the passivation layer 150 is formed. The modification layer 190 may be formed by CVD, spin-on, sputtering, and/or other suitable non-plasma film formation processes.

Next, referring to FIG. 3, after the modification layer 190 is formed, the passivation layer 150 may be formed, the source through via 144 and the drain through via 145 may be formed to penetrate through the passivation layer 150, and the source 142 and the drain 143 may be formed on the passivation layer 150. As such, the HEMT 30 shown in FIG. 3 is formed.

Figure 8:
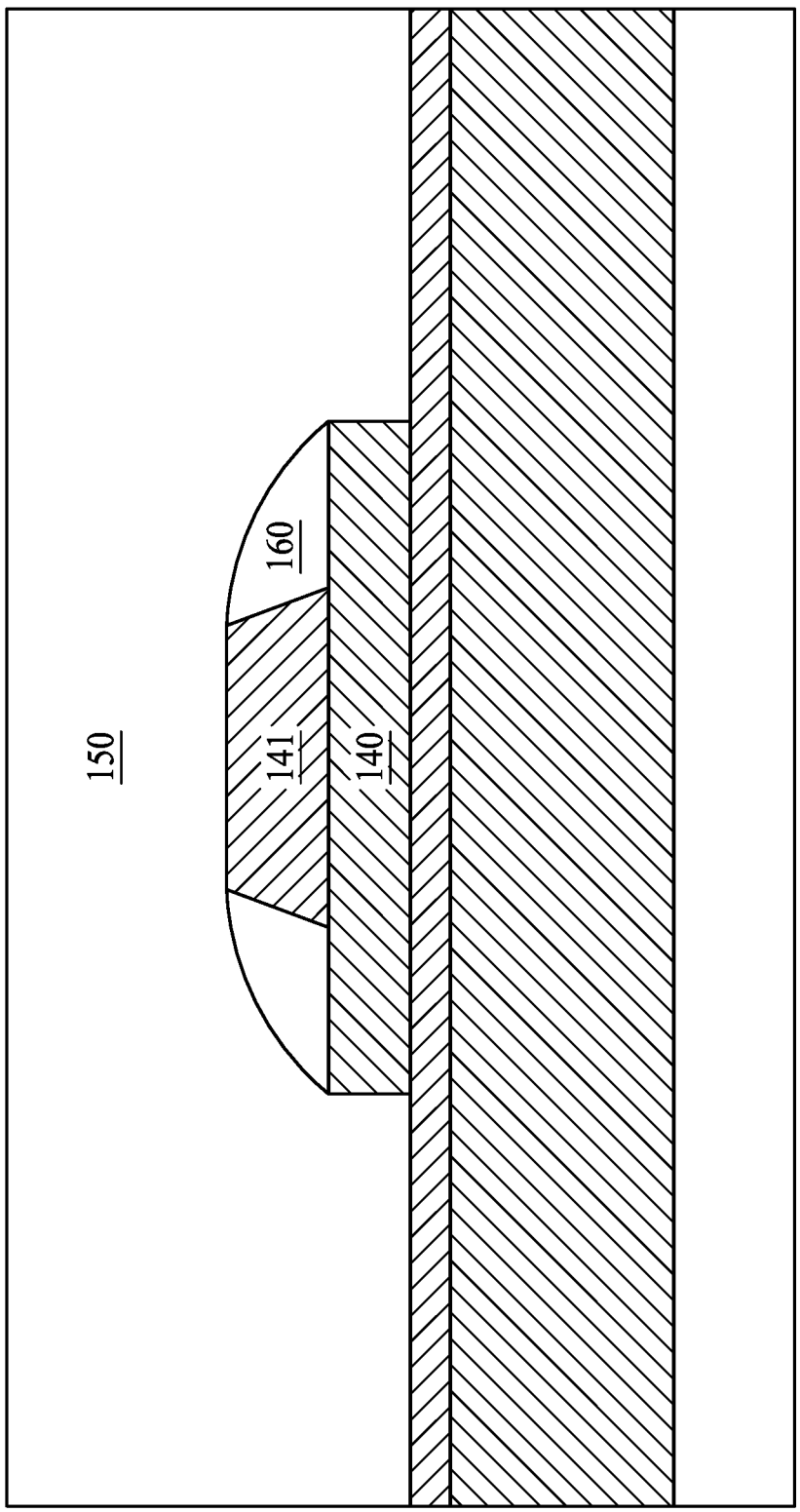
FIG. 8 illustrates an intermediate stage of a method for fabricating a HEMT according to some embodiments of the present disclosure.

FIG. 8 illustrates an intermediate stage of a method for fabricating a HEMT 50 according to some embodiments of the present disclosure.

Referring to FIG. 8, in some other embodiments, after the steps shown in FIG. 7A, FIG. 7B, FIG. 7C, FIG. 7D and FIG. 7E are performed, the insulating spacer 160 may not be removed, and the passivation layer 150 is formed on the metal gate 141 and the insulating spacer 160. Next, referring FIG. 5, the source through via 144 and the drain through via 145 may be formed to penetrate through the passivation layer 150, and the source 142 and the drain 143 may be formed on the passivation layer 150. As such, the HEMT 50 shown in FIG. 5 is formed.

FIGS. 9A, 9B, 9C, 9D, 9E, 9F and 9G illustrate a method for fabricating a HEMT 20 according to some embodiments of the present disclosure.

Figure 9A:
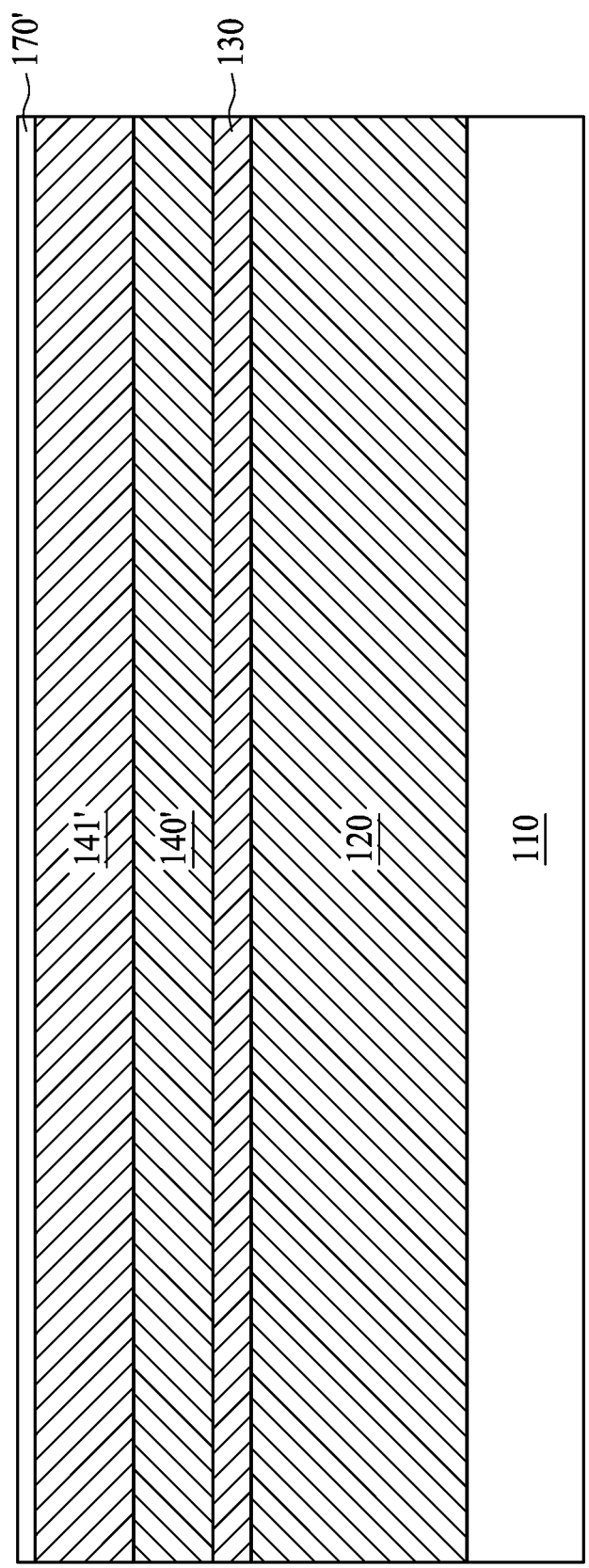
FIGS. 9A, 9B, 9C, 9D, 9E, 9F and 9G illustrate a method for fabricating a HEMT according to some embodiments of the present disclosure.

Referring to FIG. 9A, a substrate 110 is provided. Next, a channel layer 120 is formed on the substrate 110, a barrier layer 130 is formed on the channel layer 120, and a semiconductor gate material layer 140' is formed on the barrier layer 130. In some embodiments, a material of the channel layer 120 may include GaN, a material of the barrier layer 130 may include AlGaN, and a material of the semiconductor gate material layer 140' may include GaN. Then, a metal gate material layer 141' is formed on the semiconductor gate material layer 140', and a hardmask material layer 170' is formed on the metal gate material layer 141'. In some embodiments, one or more layers of materials may be deposited by PVD, CVD, electroplating and/or other suitable processes to form the semiconductor gate material layer 140' and the metal gate material layer 141'. In some embodiments, the hardmask material layer 170' may be formed by CVD, spin-on, sputtering, and/or other suitable processes.

Figure 9B:
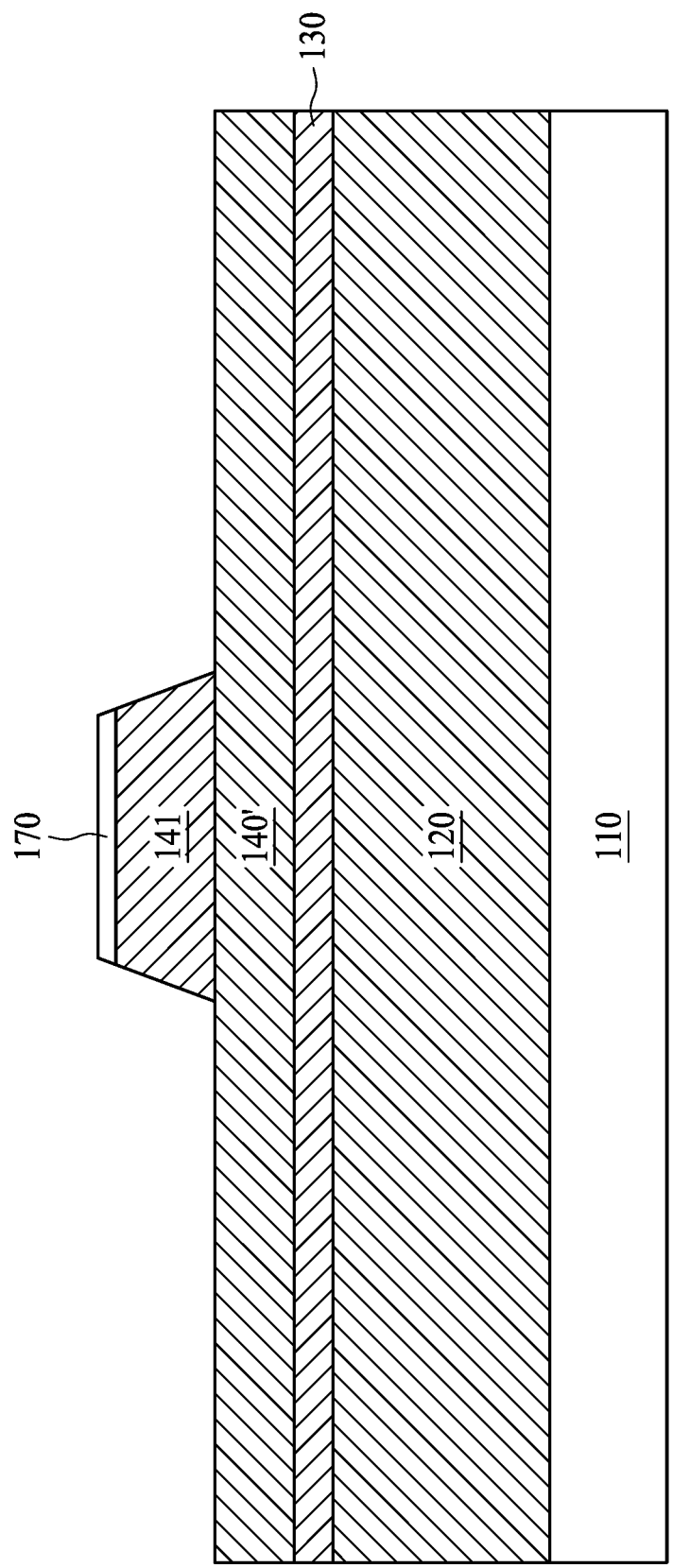

Referring to FIG. 9B, a patterning process may be performed on the hardmask material layer 170' to form a hardmask layer 170 having a shape that is identical to a predetermined shape of a metal gate 141 which will be formed subsequently. Then, an etching process is performed on the metal gate material layer 141' with the hardmask 170 formed thereon to form a metal gate 141 having a trapezoidal cross-sectional shape. In some embodiments, the metal gate 141 having a trapezoidal cross-sectional shape may be formed by anisotropic etching, for example, a plasma etching process.

Figure 9C:
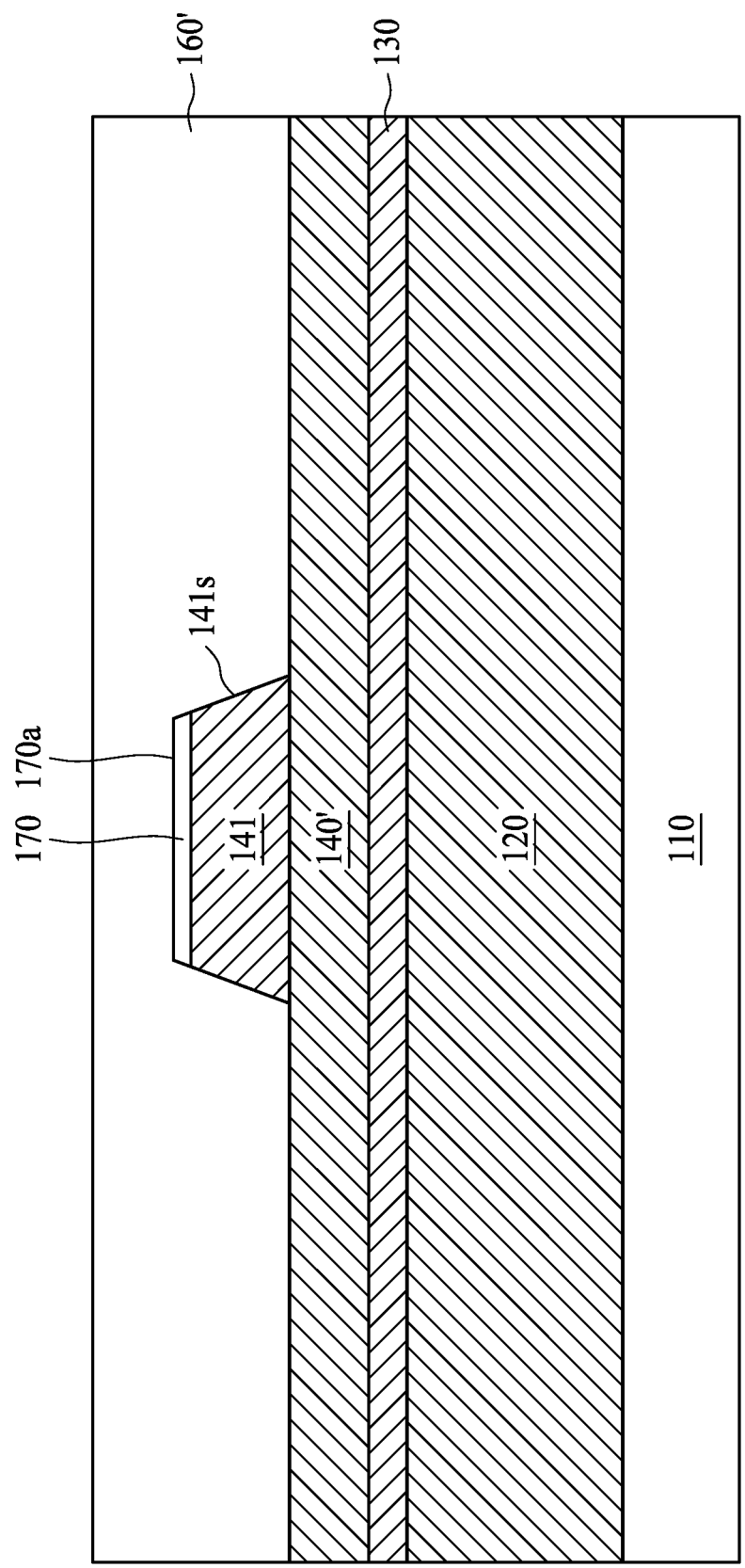

Referring to FIG. 9C, an insulating spacer material layer 160' is formed on the semiconductor gate material layer 140' and the hardmask 170. The insulating spacer material layer 160' may directly contact the sidewall 141s of the metal gate 141 and the upper surface 170a of the hardmask 170. In some embodiments, the insulating spacer material layer 160' may directly contact and fully cover the whole sidewall 141s of the metal gate 141 and the whole upper surface 170a of the hardmask 170. In some embodiments, the insulating spacer material layer 160' may be formed on the semiconductor gate material layer 140' and the hardmask 170 by plasma enhanced CVD (PECVD). By using the plasma process, the insulating spacer 160 formed subsequently can be provided with improved properties when being used as a self-aligned mask.

Figure 9D:
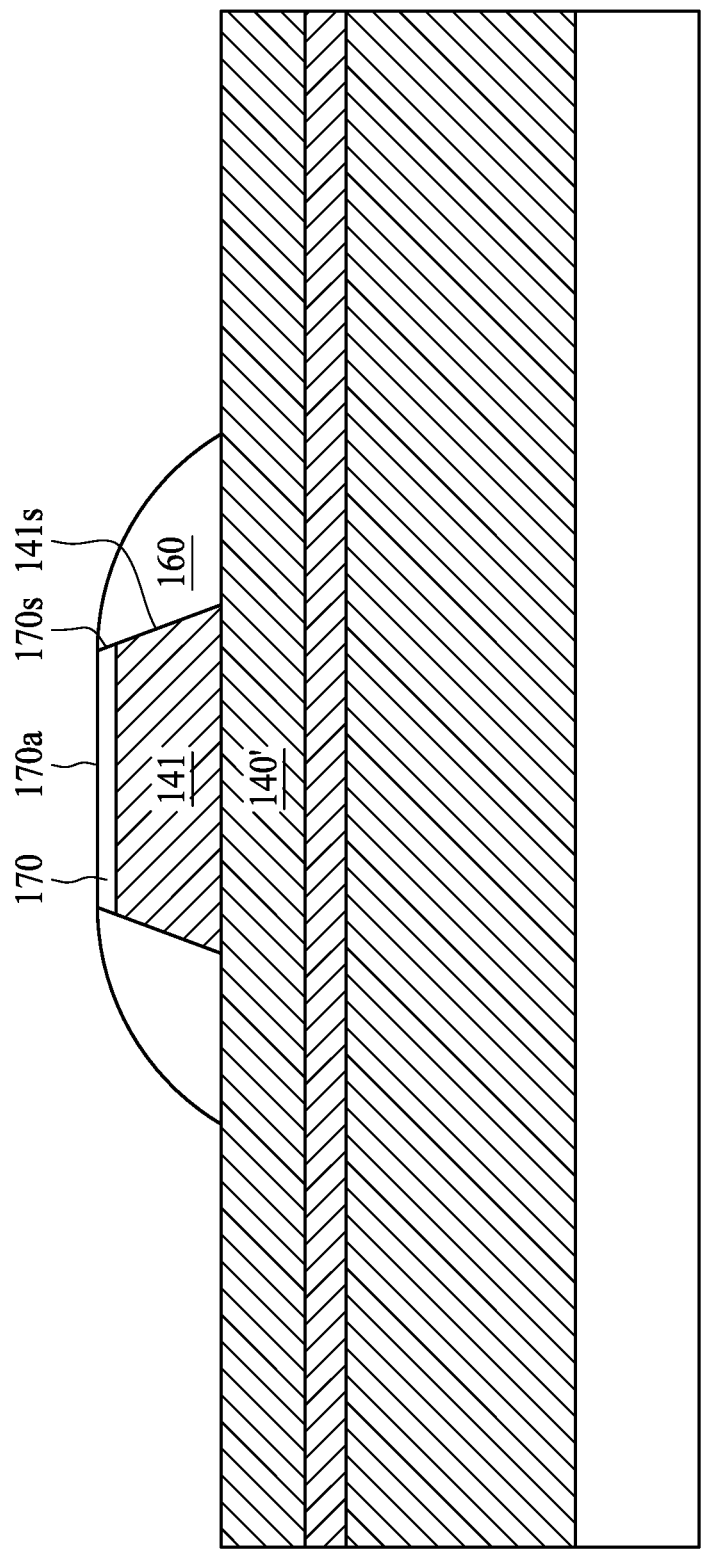

Referring to FIG. 9D, a patterning process may be performed on the insulating spacer material layer 160' to form the insulating spacer 160. In some embodiments, the insulating spacer 160 may be formed on the semiconductor gate material layer 140' and surround the metal gate 141 and the hardmask 170. In some embodiments, an anisotropic etching process may be performed to partially remove the insulating spacer material layer 160' to form the insulating spacer 160. In some embodiments, the insulating spacer material layer 160' is made of an inorganic material, and it requires using a plasma etching process to form the insulating spacer 160. In some embodiments, the insulating spacer 160 may directly contact the sidewall 141s of the metal gate 141 and the sidewall 170s of the hardmask 170. In some embodiments, the insulating spacer 160 may directly contact and fully cover the whole sidewall 141s of the metal gate 141 and the whole sidewall 170s of the hardmask 170. An upper edge of the insulating spacer 160 may be aligned with an edge of the upper surface of the hardmask 170.

Figure 9E:
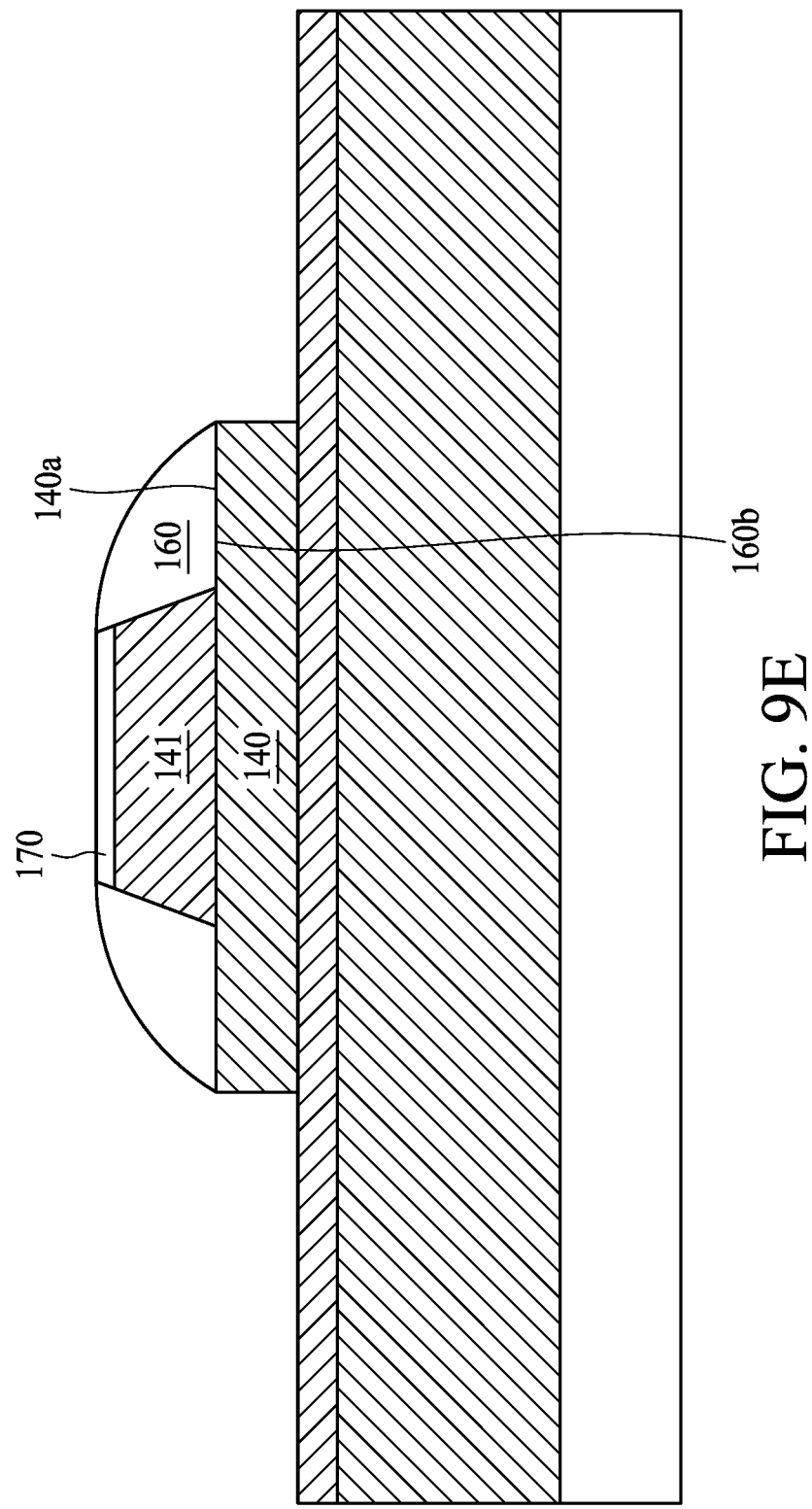

Referring to FIG. 9E, the combination of the hardmask 170, the metal gate 141 and the insulating spacer 160 may be used as a self-aligned mask to pattern the semiconductor gate material layer 140' to form the semiconductor gate 140. In some embodiments, the hardmask 170, the metal gate 141 and the insulating spacer 160 may be used as a self-aligned mask to perform an etching process, e.g., an anisotropic etching process, on the semiconductor gate material layer 140' to form the semiconductor gate 140. As shown in FIG. 9E, the edge of the upper surface (i.e., surface 140a) of the semiconductor gate 140 may be aligned with the outer edge of the bottom surface (i.e., surface 160b) of the insulating spacer 160.

In some embodiment, the hardmask 170 is not removed, such that the steps of manufacturing the HEMT 20 may be reduced, and the manufacturing process may be simplified. In addition, in some embodiments, the insulating spacer material layer 160' is made of an inorganic material, and it requires using a plasma etching process to form the insulating spacer 160. Since the hardmask 170 above the metal gate 141 remained unremoved, the hardmask 170 can further protect the metal gate 141 from being damaged in the etching process of the insulating spacer material layer 160'.

Figure 9F:
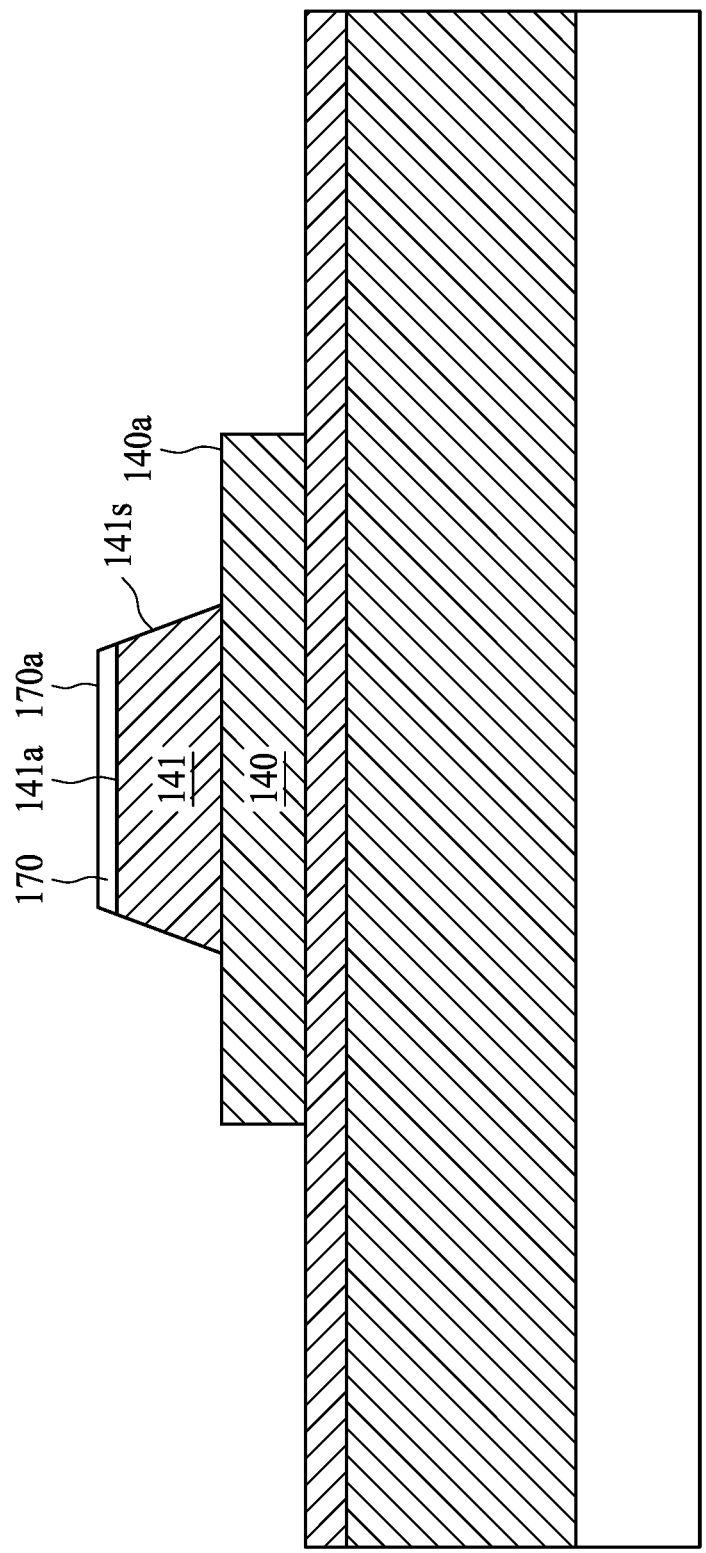

Referring to FIG. 9F, the insulating spacer 160 is removed. In some embodiments, the hardmask 170 (not shown in drawings) may be removed optionally. In some embodiments, the insulating spacer 160 and the hardmask 170 may be made of the same material, and the process for removing the insulating spacer 160 may remove hardmask 170 as well.

Figure 9G:
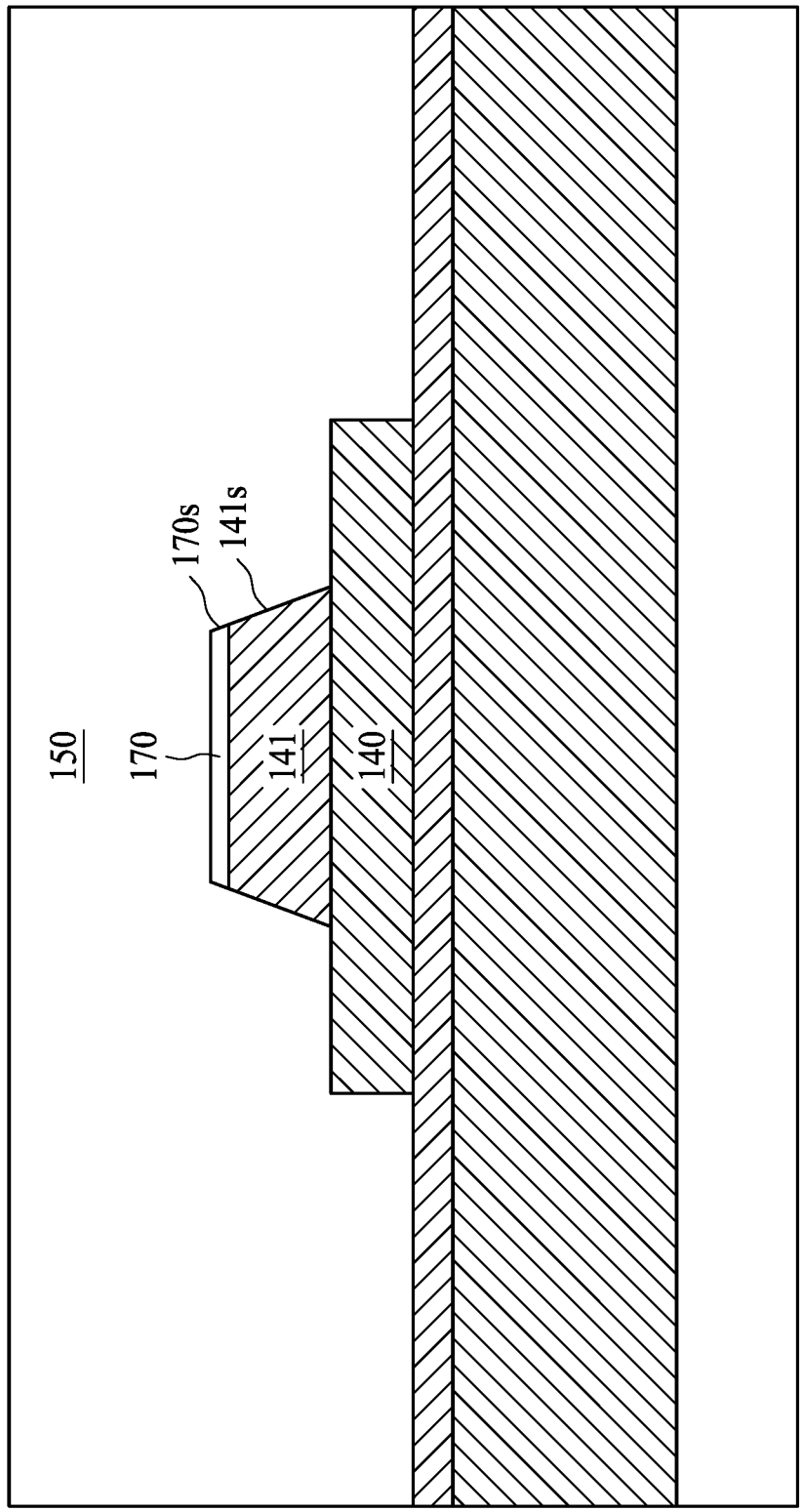

Referring to FIG. 9G, a passivation layer 150 is formed. In some embodiments, the passivation layer 150 directly contacts the metal gate 141 and the hardmask 170. The passivation layer 150 may directly contact the whole sidewall 141s of the metal gate 141 and the whole sidewall 170s of the hardmask 170. In some embodiments, the passivation layer 150 may be formed by CVD, spin-on, sputtering, and/or other suitable non-plasma film formation processes.

Next, referring to FIG. 2, a source through via 144 and a drain through via 145 may be formed to penetrate through the passivation layer 150, and a source 142 and a drain 143 are formed on the passivation layer 150. The source 142 may be connected to the barrier layer 130 through the source through via 144, and the drain 143 may be connected to the barrier layer 130 through the drain through via 145. As such, the HEMT 20 shown in FIG. 2 is formed.

In some other embodiments, referring to FIG. 4 and FIG. 9F, a modification layer 290 may be formed on the sidewall 141s of the metal gate 141 and the sidewall 170s of the hardmask 170 after the insulating spacer 160 is removed and before the passivation layer 150 is formed. The modification layer 290 may be formed by CVD, spin-on, sputtering, and/or other suitable non-plasma film formation processes Next, referring to FIG. 4, after the modification layer 290 is formed, the passivation layer 150 may be formed, the source through via 144 and the drain through via 145 may be formed to penetrate through the passivation layer 150, and the source 142 and the drain 143 may be formed on the passivation layer 150. As such, the HEMT 40 shown in FIG. 4 is formed.

Figure 10:
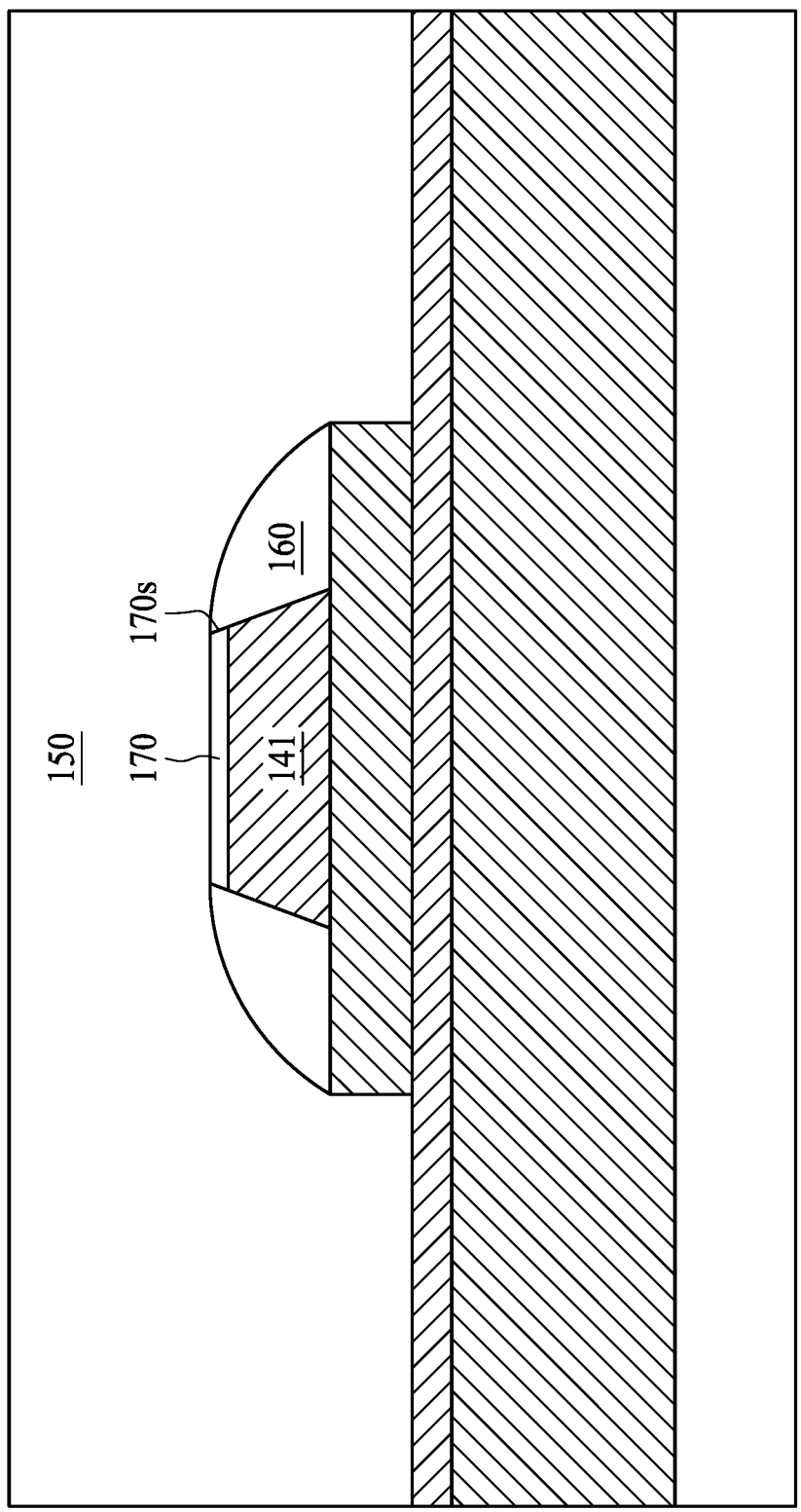
FIG. 10 illustrates an intermediate stage of a method for fabricating a HEMT according to some embodiments of the present disclosure.

FIG. 10 illustrates an intermediate stage of a method for fabricating a HEMT 60 according to some embodiments of the present disclosure.

Referring to FIG. 10, in some other embodiments, after the steps shown in FIG. 9A, FIG. 9B, FIG. 9C, FIG. 9D and FIG. 9E are performed, the insulating spacer 160 may not be removed, and the passivation layer 150 is formed on the hardmask 170, the metal gate 141 and the insulating spacer 160. Next, referring FIG. 6, the source through via 144 and the drain through via 145 may be formed to penetrate through the passivation layer 150, and the source 142 and the drain 143 may be formed on the passivation layer 150. As such, the HEMT 60 shown in FIG. 6 is formed.

Figure 11:
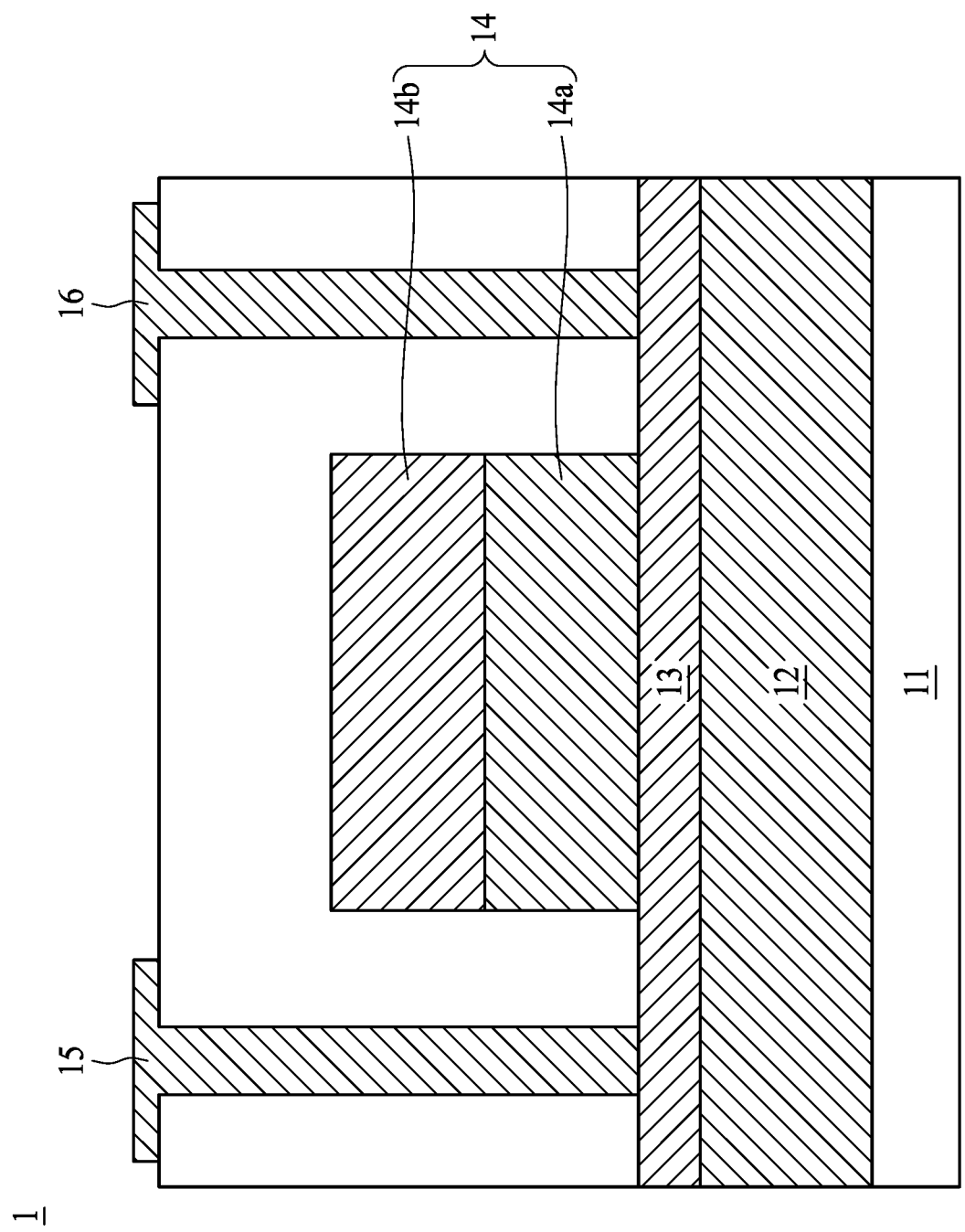
FIG. 11 illustrates a HEMT according to some embodiments of the present disclosure.

FIG. 11 illustrates a HEMT 1 according to some embodiments of the present disclosure. As shown in FIG. 11, the HEMT 1 includes a silicon substrate 11, a channel layer 12, a barrier layer 13, and a gate 14 stacked on one another. In addition, the HEMT 1 further includes a source 15 and a drain 16, and the source 15 and the drain 16 are both connected to the barrier layer 13. The gate 14 includes a semiconductor gate 14a and a metal gate 14b. Since the edge of the bottom surface of the metal gate 14b is aligned with the edge of the upper surface of the semiconductor gate 14a, there is not distance between the edges. Therefore, when the metal gate 14b receives a positive bias voltage, the electrical field at the edge of the semiconductor gate 14a is relatively strong. In addition, the leakage current path only includes the height portion at the lateral side of the semiconductor gate 14a, and thus the leakage current path of the gate is relatively short, thereby the HEMT 1 has a relatively high leakage current and a relatively low breakdown voltage.

Figure 12:
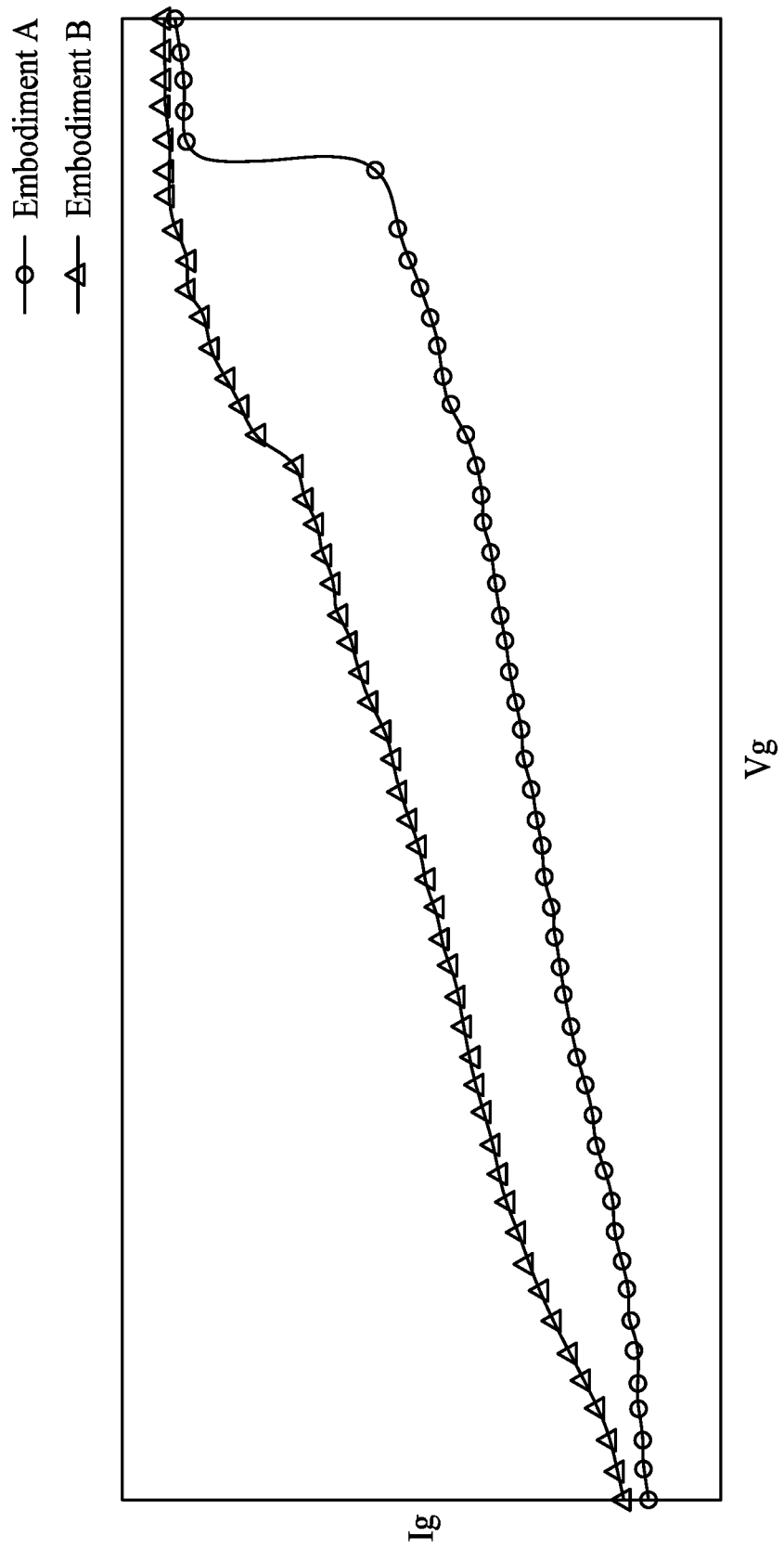
FIG. 12 shows curves of the gate voltage (Vg) vs. the gate leakage current (Ig) according to some embodiments of the present disclosure.

FIG. 12 shows the gate voltage (Vg) vs. the gate leakage current (Ig) according to some embodiments of the present disclosure. Embodiment A in FIG. 12 refers to the HEMT in FIG. 1, and Embodiment B in FIG. 12 refers to the HEMT in FIG. 11. As shown in FIG. 12, the HEMT 10 as illustrated by Embodiment A has a lower leakage current and a higher gate breakdown voltage.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A high electron mobility transistor (HEMT), comprising:
   a substrate;
   a channel layer disposed on the substrate;
   a barrier layer disposed on the channel layer;
   a semiconductor gate layer disposed on the barrier layer;
   a metal gate layer disposed on the semiconductor gate layer, wherein the metal gate layer is a trapezoidal cross-sectional shape, a first surface of the metal gate layer contacts a first surface of the semiconductor gate layer, and an edge of the first surface of the metal gate layer is located inside an edge of the first surface of the semiconductor gate layer wherein the first surface of the metal gate layer is a base of the trapezoidal cross-sectional shape having a total width W1;

a passivation layer directly contacting the metal gate;

wherein the edge of the first surface of the metal gate layer is separated from the edge of the first surface of the semiconductor gate layer at the base of the trapezoidal cross-sectional shape by an indent total distance D1, and a ratio of the indent total distance D1 to the total width of the metal gate layer at its base W1 is in a range from about 0.2 to about 0.65; and wherein a ratio of the indent total distance D1 to a total thickness of the semiconductor gate layer T1 is in a range from about 3 to about 7.

2. The HEMT according to claim 1, wherein a cross-sectional width of the metal gate decreases towards a direction away from the semiconductor gate layer.

3. The HEMT according to claim 1, wherein a sidewall of the metal gate layer extends towards a direction away from the first surface of the metal gate layer, and the passivation layer directly contacts the sidewall and an upper surface of the metal gate layer.

4. The HEMT according to claim 1, wherein the ratio of the indent total distance to the total width of the metal gate W1 is in a range from about 0.25 to about 0.6.

5. The HEMT according to claim 1, further comprising a hardmask disposed on the metal gate layer.

6. The HEMT according to claim 5, wherein a first surface of the hardmask directly contacts the metal gate layer, and a width of the first surface of the hardmask is less than a width of the first surface of the metal gate layer.

7. The HEMT according to claim 5, wherein the first surface of the hardmask faces towards the metal gate layer, a sidewall of the hardmask extends towards a direction away from the first surface of the hardmask, and the passivation layer directly contacts the sidewall of the hardmask.

8. The HEMT according to claim 1, wherein a sidewall of the metal gate layer extends towards a direction away from the first surface of the metal gate layer, a sidewall of the semiconductor gate layer extends towards the first surface of the semiconductor gate layer, and a slope of the sidewall of the semiconductor gate layer is less than a slope of the sidewall of the metal gate layer.

9. The HEMT according to claim 1, further comprising a source and a drain disposed on the passivation layer, the source is connected to the barrier layer through a source through via in the passivation layer, and the drain is connected to the barrier layer through a drain through via in the passivation layer.

10. The HEMT according to claim 1, wherein the substrate comprises a silicon material, a material of the channel layer comprises GaN, a material of the barrier layer comprises AlGaN, and a material of the semiconductor gate layer comprises GaN.

11. A high electron mobility transistor (HEMT), comprising:
a substrate;
a channel layer disposed on the substrate;
a barrier layer disposed on the channel layer;
a semiconductor gate layer disposed on the barrier layer;
a metal gate layer disposed on the semiconductor gate layer, wherein the metal gate layer is a trapezoidal cross-sectional shape, a first surface of the metal gate layer contacts a first surface of the semiconductor gate layer, and an edge of the first surface of the metal gate layer is located inside an edge of the first surface of the semiconductor gate layer wherein the first surface of the metal gate layer is a base of the trapezoidal cross-sectional shape having a total width W1;

a modification layer directly contacting the metal gate layer, wherein the modification layer bends at the edge of the first surface of the metal gate layer;

wherein the edge of the first surface of the metal gate layer is separated from the edge of the first surface of the semiconductor gate layer at the base of the trapezoidal cross-sectional shape by an indent total distance D1, and a ratio of the indent total distance D1 to the total width of the metal gate layer at its base W1 is in a range from about 0.2 to about 0.65; and wherein a ratio of the indent total distance D1 to a total thickness of the semiconductor gate layer T1 is in a range from about 3 to about 7.

12. The HEMT according to claim 11, wherein a sidewall of the metal gate layer extends towards a direction away from the first surface of the metal gate layer, and the modification layer directly contacts the sidewall of the metal gate layer.

13. The HEMT according to claim 11, wherein a second surface of the metal gate layer is opposite to the first surface of the metal gate layer, and the modification layer directly contacts the second surface of the metal gate layer.

14. The HEMT according to claim 11, wherein the modification layer comprises aluminum oxide, aluminum nitride, silicon nitride formed by a non-plasma film formation process, or a combination thereof.

15. A method for fabricating a high electron mobility transistor (HEMT), comprising:
providing a substrate;
forming a channel layer on the substrate;
forming a barrier layer on the channel layer;
forming a semiconductor gate layer on the barrier layer;
forming a metal gate layer on the semiconductor gate, wherein the metal gate is a trapezoidal cross-sectional shape, a first surface of the metal gate layer contacts a first surface of the semiconductor gate layer, and an edge of the first surface of the metal gate layer is located inside an edge of the first surface of the semiconductor gate layer wherein the first surface of the metal gate layer is a base of the trapezoidal cross-sectional shape having a total width W1;
forming a passivation layer directly contacting the metal gate layer;
wherein the edge of the first surface of the metal gate layer is separated from the edge of the first surface of the semiconductor gate layer at the base of the trapezoidal cross-sectional shape by an indent total distance D1, and a ratio of the indent total distance D1 to the total width of the metal gate layer at its base W1 is in a range from about 0.2 to about 0.65; and
wherein a ratio of the indent total distance D1 to a total thickness of the semiconductor gate layer T1 is in a range from about 3 to about 7.

16. The method according to claim 15, wherein forming the semiconductor gate layer comprises:
forming a semiconductor gate material layer on the barrier layer before forming the metal gate layer;
forming the metal gate layer and an insulating spacer on the semiconductor gate material layer, the insulating spacer directly contacting a sidewall of the metal gate layer;

etching the semiconductor gate material layer using the metal gate layer and the insulating spacer as a mask to form the semiconductor gate layer; and removing the insulating spacer.

17. The method according to claim 16, wherein forming the insulating spacer comprises:

forming an insulating spacer material layer on the semiconductor gate material layer, the insulating spacer material layer directly contacting the sidewall of the metal gate; and performing an anisotropic etching process to partially remove the insulating spacer material layer to form the insulating spacer.

18. The method according to claim 15, wherein forming the metal gate layer comprises:

forming a semiconductor gate material layer on the barrier layer;

forming a metal gate material layer on the semiconductor gate material layer;

forming a hardmask on the metal gate material layer; and performing an anisotropic etching process on the metal gate material layer with the hardmask formed thereon to form the metal gate layer having the trapezoidal cross-sectional shape.

19. The method according to claim 18, wherein forming the metal gate layer further comprises:

removing the hardmask before forming the passivation layer.

20. The method according to claim 15, wherein forming the metal gate layer comprises:

forming a semiconductor gate material layer on the barrier layer;

forming a metal material on the semiconductor gate material layer by sputtering or evaporation to form a metal gate material layer; and performing a lift-off process to partially remove the metal gate material layer to form the metal gate layer having the trapezoidal cross-sectional shape.

21. The method according to claim 15, wherein a sidewall of the metal gate layer extends towards a direction away from the first surface of the metal gate layer, and the method further comprises:

forming a modification layer on the sidewall of the metal gate layer before forming the passivation layer.

22. The method according to claim 15, further comprising:

forming a source through via and a drain through via penetrating through the passivation layer; and forming a drain and a source, wherein the source is connected to the barrier layer through the source through via, and the drain is connected to the barrier layer through the drain through via.

23. The method according to claim 15, wherein the substrate comprises a silicon material, a material of the channel layer comprises GaN, a material of the barrier layer comprises AlGaN, and a material of the semiconductor gate comprises GaN.

* * * * *